United States Patent [19]
Lee

[11] Patent Number: 5,856,049
[45] Date of Patent: Jan. 5, 1999

[54] PHASE SHIFT MASK AND METHOD FOR MANUFACTURING SAME

[75] Inventor: Jun Seok Lee, Seoul, Rep. of Korea

[73] Assignee: LG Semicon Co., Ltd., Chungcheongbuk-Do, Rep. of Korea

[21] Appl. No.: 788,104

[22] Filed: Jan. 23, 1997

[30] Foreign Application Priority Data

May 2, 1996 [KR] Rep. of Korea .................. 1996-14270

[51] Int. Cl.$^6$ ....................................................... G03F 9/00
[52] U.S. Cl. ................................................................ 430/5
[58] Field of Search ............................... 430/5, 322, 323, 430/324

[56] References Cited

U.S. PATENT DOCUMENTS

| | | | |
|---|---|---|---|
| 5,286,581 | 2/1994 | Lee ............................................. | 430/5 |
| 5,362,584 | 11/1994 | Brock et al. ................................ | 430/5 |
| 5,484,672 | 1/1996 | Bajuk et al. ................................ | 430/5 |

OTHER PUBLICATIONS

Richard A. Ferguson et al., "Impact of Attenuated Mask Topography on Lithographic Performance", *SPIE*, vol. 2197 (1994), pp. 130–139.

Emi Tamechika et al., "Resolution Improvement Using Auxiliary Pattern Groups in Oblique Illumination Lithography", *Jpn. J. Appl. Phys*, vol. 32, (1993), pp. 5856–5862.

Marc D. Levenson et al., "Improving Resolution in Photolithography with a Phase–Shifting Mask", IEEE Transactions on Electron Devices, vol. ED–29, No. 12, (Dec. 1982), pp. 1828–1836.

Burn J. Lin, "The Attenuated Phase–Shifting Mask", *Solid State Technology,* (Jan. 1992), Abstract.

*Primary Examiner*—S. Rosasco
*Attorney, Agent, or Firm*—Morgan, Lewis & Bockius LLP

[57] ABSTRACT

A phase shift mask device includes a transparent substrate; a first rim type part on the transparent substrate, the first rim type mask part including a first phase shift layer, a second phase shift layer adjacent the first phase shift layer, and a light transparent portion adjacent the second phase shift layer; a first outrigger type mask part on the transparent substrate spaced from the first rim type mask part by a first distance, the first outrigger type mask part including a first phase shift layer, a second phase shift layer adjacent the first phase shift layer, a shielding layer adjacent the first phase shift layer, and a light transparent portion adjacent the second phase shift layer; a second rim type mask part on the transparent substrate having a diagonal relationship with respect to the first rim type mask, the second rim type mask part including a first phase shift layer, a second phase shift layer adjacent the first phase shift layer, and a light transparent layer portion adjacent the second phase shift layer; and a second outrigger type mask part on the transparent substrate having a diagonal relationship with respect to the first outrigger type mask part, the second outrigger type mask part including a first phase shift layer, a second phase shift layer adjacent the first phase shift layer, a shielding layer adjacent the first phase shift layer, and a light transparent portion adjacent the second phase shift layer.

47 Claims, 27 Drawing Sheets

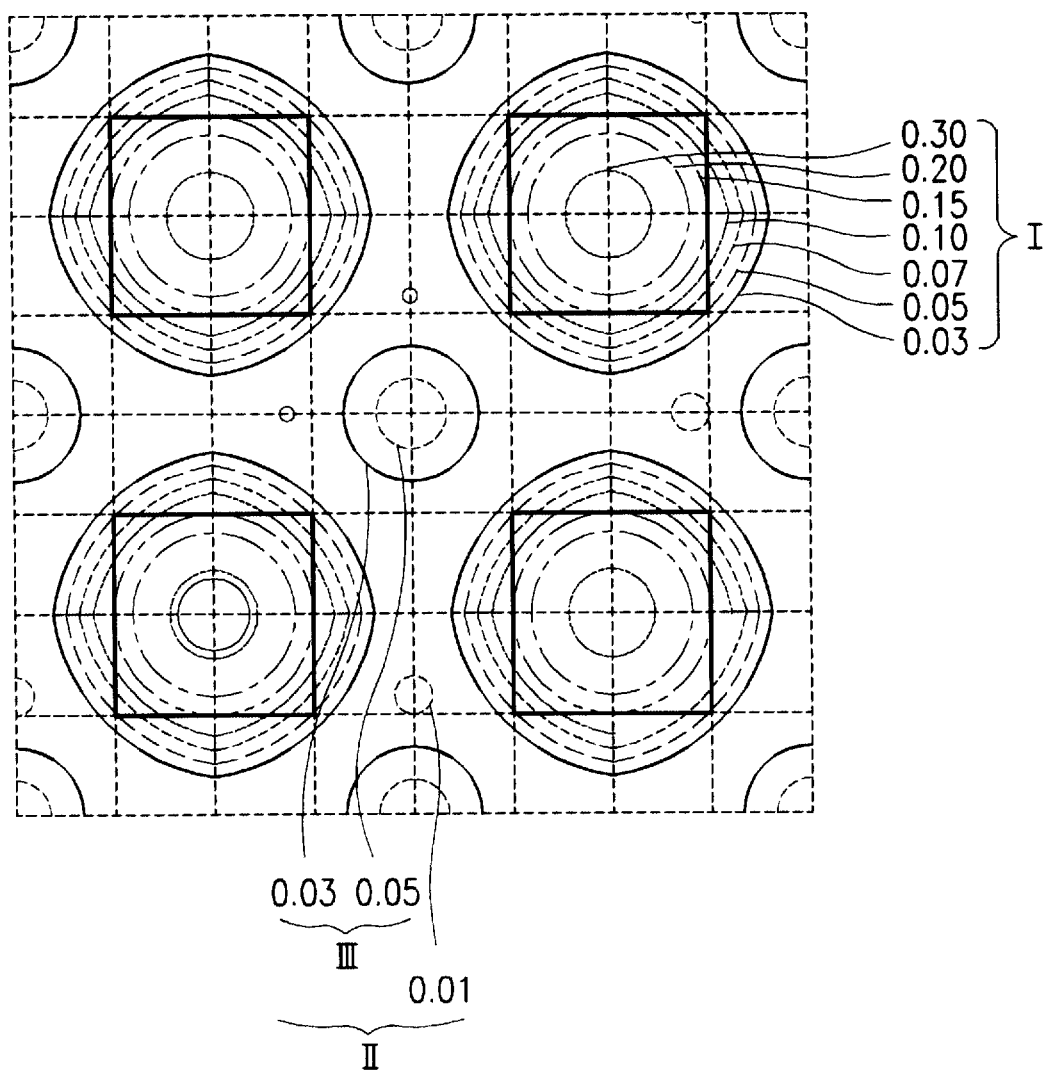

PHASE SHIFT MASK AND METHOD FOR MANUFACTURING SAME

BACKGROUND OF THE INVENTION

1. Field of the Invention

The present invention relates to a phase shift mask, and more particularly, to a phase shift mask for a semiconductor device and method for manufacturing the same.

2. Discussion of the Related Art

Generally, a photolithography process widely applied in a process of manufacturing a semiconductor device employs a photomask. The photomask is divided into a portion for transmitting light and a portion for blocking the light in accordance with a desired shape of the semiconductor device. A general photomask is formed of a shielding pattern and a transparent pattern to enable selective exposure. But an increase in the pattern density induces diffraction to restrict improvement of resolution.

Therefore, a process for improving the resolution by using a phase shift mask has been continuously studied in various fields. In a technique of utilizing the phase shift mask, a general penetrating area is combined with a penetrating area that is phase-shifted by 180° by means of a phase shifting material to be utilized as a transmitting area. This is for bringing about an offset coherence between the penetrating areas at a shielding area to decrease the diffraction of light.

Also, modified masks applied with a phase difference of light are introduced together with the development of a mask manufacturing technique to enlarge an optical resolution confinement.

Such a general photomask will be described with reference to FIGS. 1a to 1d.

FIG. 1a is a plan view showing a general photomask, FIG. 1b represents a graph plotting an. amplitude of light on the photomask shown in FIG. 1a, FIG. 1c represents a graph plotting an amplitude of light on a wafer after passing through the photomask shown in FIG. 1a, and FIG. 1d represents a graph plotting an intensity of the light on the wafer after passing through the photomask shown in FIG. 1a.

A general mask is provided by classifying a penetrating area 1 for transmitting the light and a shielding area 4 for blocking the light on a transparent substrate as shown in FIG. 1a. However, in the general mask, the coherence adversely affects a boundary plane of shielding area 4 and penetrating area 1 to result in a limited resolution where an overall profile becomes gentle or gradual since a light energy cannot effectively reach the surface of a resist. In other words, although the amplitude on the mask is as shown in FIG. 1b, the coherence is produced at the boundary plane of penetrating area 1 and shielding area 4 to smooth the light energy and light intensity as shown in FIGS. 1c and 1d.

In order to improve the above-stated drawback of the general photomask, several phase shift masks have been under development.

Starting from an alternate type phase shift mask of Levenson, a rim type phase shift mask for forming a shielding pattern and a phase shift layer suggested by Nitayama et al. was presented to improve the resolution limit of a contact hole. Recently, a half-tone mask (i.e., attenuated phase shift mask) was developed to thereby decrease an area of the phase shift mask.

The conventional phase shift mask will be described with reference to FIGS. 2a to 2d.

FIG. 2a is a plan view showing a general phase shift mask, FIG. 2b represents a graph plotting an amplitude of light on the phase shift mask shown in FIG. 2a, FIG. 2c represents a graph plotting an amplitude of light on a wafer after passing through the phase shift mask shown in FIG. 2a, and FIG. 2d is a graph representation plotting an intensity of the light on the wafer after passing through the phase shift mask shown in FIG. 2a.

The conventional phase shift mask having a single isolation pattern, as shown in FIG. 2a, has a penetrating area 1 for transmitting light on a transparent substrate and a half-tone phase shift layer 2 for transmitting light by approximately below 30% to a shielding area and shifting the others. Therefore, as shown in FIG. 2b, a great amplitude difference can be obtained between the penetrating area and the shielding area to prevent offset and reinforcement of the light energy at the boundary plane of the penetrating area and shielding area, as shown in FIGS. 2c and 2d, thereby obtaining an accurate mask pattern.

However, in a phase shift: mask having a plurality of isolation patterns (penetrating pattern) arranged adjacent to each other, the offset and reinforcement of the light energy occur between adjacent isolation patterns. This will be described in detail with reference to FIGS. 3 and 4a to 4d.

FIG. 3 is a plan view showing a conventional phase shift mask having a plurality of isolation patterns, FIG. 4a is a sectional view showing a phase shift mask taken along line I—I' of FIG. 3, FIG. 4b represents a graph plotting an amplitude of light on a wafer after passing through the phase shift mask taken along line I—I' of FIG. 3, FIG. 4c is a graph representation plotting an amplitude of light on the wafer after passing through the phase shift mask taken along line I'—I" of FIG. 3, and FIG. 4d is a graph representation plotting an intensity of the light on the wafer after passing through the phase shift mask taken along line I—I" of FIG. 3.

The light energy distribution of respective isolation patterns when four isolation patterns are adjacent to one another by the same distance as shown in FIG. 3 will be described below.

Referring to FIG. 4a, reference numeral 1 denotes the penetrating area; 2 is a half-tone phase shift layer which is a semi-transparent layer for shifting the phase, and 3 is a transparent substrate.

In considering the light energy between two isolation patterns, as shown in FIG. 4a, the reinforcing coherence of negative (−) amplitude component light appears at a point about one-half (½) the distance from centers of respective isolation patterns. Thus, as the energy of a light source is increased to enhance the resolution of penetrating area 1, the size of an unnecessary pattern is increased greatly. In other words, since two isolation patterns have the amplitudes as shown in FIGS. 4b and 4c, the negative (−) reinforcing coherence of the light occurs at a point one-half (½) the distance from the centers of respective isolation patterns.

Consequently, the unnecessary pattern size is enlarged in proportion to the energy of the light source. At this time, if the light intensity of the half-tone phase shift layer exceeds a threshold, the unnecessary pattern affects an etching on a substrate underlying the resist.

Moreover, the negative (−) amplitude reinforcing coherence of the light is generated at a portion b (FIG. 3) where four isolation patterns overlap one another and which has the greatest increase in the unnecessary light energy. This will be described with reference to FIGS. 5a–5d and 6.

FIG. 5a is a sectional view showing the phase shift mask taken along lines II—II' and III—III' of FIG. 3. FIG. 5b represents a graph plotting the amplitude of light on the wafer after passing through the phase shift mask taken along line II—II' of FIG. 3. FIG. 5c is a graph representation plotting the amplitude of the light on the wafer after passing through the phase shift mask taken along line III—III' of FIG. 3. FIG. 5d represents a graph obtained by adding the intensity of the light on the wafer after passing through the phase shift mask taken along line II—II' of FIG. 3 to the intensity of the light on the wafer after passing through the phase shift mask taken along line III—III' of FIG. 3. FIG. 6 shows a distribution of the light intensity of the conventional phase shift mask having the plurality of isolation patterns.

In FIG. 5a, the sectional view is obtained by overlapping the sectional views of the phase shift mask taken along lines II—II' and IV—IV' of FIG. 3. Here, the amplitude of the light on the wafer having passed through transparent substrate 3 is identical as shown in FIGS. 5b and 5c. But, as shown in FIG. 5d, the light intensity at point b (FIG. 3), where the amplitude on the wafer as shown in FIG. 5b overlaps the amplitude on the wafer as shown in FIG. 5c, exceeds the threshold ("critical position" in FIG. 5d). Thus, an undesired abnormal pattern or side lobe is formed.

The light energy distribution on the surface of the wafer in conformity with this principle is evaluated by a simulation tool called FAIM, which is shown in FIG. 6 (where an interval between dotted lines is 0.2 $\mu$m). More specifically, FIG. 6 illustrates that when the light intensity of penetrating area 1 is sequentially displayed from 0.8 to 0, the light intensity having distribution I of 0.3~0.03 in penetrating area 1 and around the penetrating area to allow for the desired isolation pattern across the light intensity area of 0.03.

In addition, the light intensity by the (−) amplitude at four penetrating areas 1 is formed through distribution II of 0.01~0.05 where penetrating areas 1 overlap with each other to induce possible formation of an abnormal pattern due to the side lobe on light intensity distribution III of 0.03~0.06.

As described above, the conventional phase shift mask having the repeatedly-formed isolation patterns has the following problems.

When the attenuated phase shift mask is utilized to perform the exposure, the light intensity slope becomes steep to obtain a desired pattern exactly. However, when the plurality of penetrating areas exist, the unnecessary abnormal pattern is formed at the diagonally-overlapping place of them. Because of this unnecessary abnormal pattern size is increased as the intensity of the light source is increased.

SUMMARY OF THE INVENTION

Accordingly, the present invention is directed to a phase shift mask and a method for manufacturing the same that substantially obviates one or more of the problems due to limitations and disadvantages of the related art.

An object of the present invention is to provide a phase shift mask and a manufacturing method for preventing an abnormal pattern generation caused by overlapping side lobes while enhancing resolution.

To achieve these and other advantages and in accordance with the purpose of the present invention, as embodied and broadly described, phase shift mask device comprises a transparent substrate; a first rim type mask part on the transparent substrate, the first rim type mask part including a first phase shift layer, a second phase shift layer adjacent the first phase shift layer, and a light transparent portion adjacent the second phase shift layer; a first outrigger type mask part on the transparent substrate spaced from the first rim type mask part by a first distance, the first outrigger type mask part including a first phase shift layer, a second phase shift layer adjacent the first phase shift layer, a shielding layer adjacent the first phase shift layer, and a light transparent portion adjacent the second phase shift layer; a second rim type mask part on the transparent substrate having a diagonal relationship with respect to the first rim type mask, the second rim type mask part including a first phase shift layer, a second phase shift layer adjacent the first phase shift layer, and a light transparent layer portion adjacent the second phase shift layer; and a second outrigger type mask part on the transparent substrate having a diagonal relationship with respect to the first outrigger type mask part, the second outrigger type mask part including a first phase shift layer, a second phase shift layer adjacent the first phase shift layer, a shielding layer adjacent the first phase shift layer, and a light transparent portion adjacent the second phase shift layer.

In another aspect of the present invention, a phase shift mask device comprises a substrate; a first type mask portion having a first phase shift characteristic on a first region of the substrate; a second type mask portion having a second phase shift characteristic on a second region of the substrate, the second phase characteristic being different from the first phase shift characteristic; a third type mask portion having a third phase shift characteristic on a third region of the substrate, the third region having a diagonal relationship with the first region, and the third phase shift characteristic being substantially same as the first phase shift characteristic; and a fourth type mask portion having a fourth phase shift characteristic on a fourth region of the substrate, the fourth region having a diagonal relationship with the second region, and the fourth type mask portion being substantially the same as the second phase shift characteristic.

In another aspect of the present invention, a method for making a phase shift mask device having a transparent substrate comprises the steps of forming a first rim type mask part on the transparent substrate, the first rim type mask including a first phase shift layer, a second phase shift layer adjacent the first phase shift layer, and a light transparent portion adjacent the second phase shift layer; forming a first outrigger type mask part on the transparent substrate spaced from the first rim type mask part by a first distance, the first outrigger type mask part including a first phase shift layer, a second phase shift layer adjacent the first phase shift: layer, a shielding layer adjacent the first phase shift layer, and a light transparent portion adjacent the second phase shift layer; forming a second rim type mask part on the transparent substrate having a diagonal relationship with respect to the first rim type mask, the second rim type mask part including a first phase shift layer, a second phase shift layer adjacent the first phase shift layer, and a light transparent layer portion adjacent the second phase shift layer; and forming a second outrigger type mask part on the transparent substrate having a diagonal relationship with respect to the first outrigger type mask part, the second outrigger type mask part including a first phase shift layer, a second phase shift layer adjacent the first phase shift layer, a shielding layer adjacent the first phase shift layer, and a light transparent portion adjacent the second phase shift layer.

In a further aspect of the present invention, a method for manufacturing a phase shift mask comprises the steps of sequentially forming a phase shift layer, a half-tone phase shift layer, and a shielding layer on a transparent substrate; patterning the shielding layer to form two shielding layer patterns having hollow centers; patterning the half-tone phase shift layer to form two half-tone phase shift layer patterns below the two shielding layer patterns using a first mask; removing a portion of the phase shift layer to form a corresponding open area exposing the substrate and within the half-tone phase shift layer patterns using a second mask; and patterning the phase shift layer to form two open areas at outer sides of the half-one phase shift layer patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1b represents a graph plotting an amplitude of light on the photomask shown in FIG. 1a;

FIG. 1c represents a graph plotting an amplitude of the light on a wafer after passing through the photomask shown in FIG. 1a;

FIG. 1d represents a graph plotting an intensity of the light on the wafer after passing through the photomask shown in FIG. 1a;

FIG. 2b represents a graph plotting an amplitude of light on the phase shift mask shown in FIG. 2a;

FIG. 2c represents a graph plotting an amplitude of the light on a wafer after passing through the phase shift mask shown in FIG. 2a;

FIG. 2d represents a graph plotting an intensity of the light on the wafer after passing through the phase shift mask shown in FIG. 2a;

FIG. 6 shows light intensity distribution of the conventional phase shift mask having the plural isolation patterns;

FIG. 10b represents a graph plotting an amplitude of the light on the wafer after passing through the phase shift mask shown in FIG. 10a;

FIG. 10c represents a graph plotting an intensity of the light on the wafer after passing through the phase shift mask shown in FIG. 10a;

FIG. 15b represents a graph plotting an amplitude of the light on the wafer after passing through the phase shift mask shown in FIG. 15a;

FIG. 15c represents a graph plotting an intensity of the light on the wafer after passing through the phase shift mask shown in FIG. 15a;

FIG. 16b represents a graph plotting the amplitude of the light on the wafer after passing through the phase shift mask shown in FIG. 16a; and FIG. 16c represents a graph plotting the intensity of the light on the wafer after passing through the phase shift mask shown in FIG. 16a.

DETAILED DESCRIPTION OF THE PREFERRED EMBODIMENTS

The present invention discloses a phase shift mask including a transparent substrate. A first rim type mask portion is formed on the transparent substrate, and a first outrigger type mask portion is formed on the transparent substrate to be spaced apart from the first rim type mask portion by a prescribed distance. A second rim type mask portion is formed in the diagonal direction to the first rim type mask portion on the transparent substrate, and a second outrigger type mask portion is formed in the diagonal direction to the first outrigger type mask portion on the transparent substrate. Here, respective rim type mask portions have the phase shift layer formed on the transparent substrate and have open areas and a half-tone phase shift layer formed on the phase shift layer and having open areas larger than the open areas of the phase shift layer. Also, respective outrigger type mask portions have the phase shift layer formed on the transparent substrate and having an island formed of a main portion and an edge portion, the half-tone phase shift layer being formed on the phase shift layer except at the main portion, and a shielding layer pattern formed on the half-tone phase shift layer placed within the island.

The present invention also discloses a method for manufacturing a phase shift mask including the steps of sequentially forming a phase shift layer, a half-tone phase shift layer, and a shielding layer on a transparent substrate. The shielding layer is patterned to form two shielding layer patterns shaped as a hollow pole having a point symmetry relation. Then, the half-tone phase shift layer is patterned to form two half-tone phase shift layer patterns below the two shielding layer patterns and to form open areas of a same size to be symmetrical to the two shielding layer patterns with respect to a plane. The phase shift layer is patterned to form two open areas below two open areas to be narrower than the two open areas of the half-tone phase shift layer.

Reference will now be made in detail to the preferred embodiments of the present invention, examples of which are illustrated in the accompanying drawings.

Figure 1A:
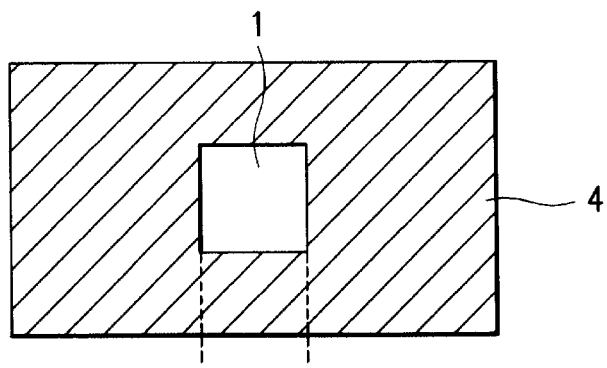
FIG. 1a is a plan view showing a general photomask.
Figure 1B:
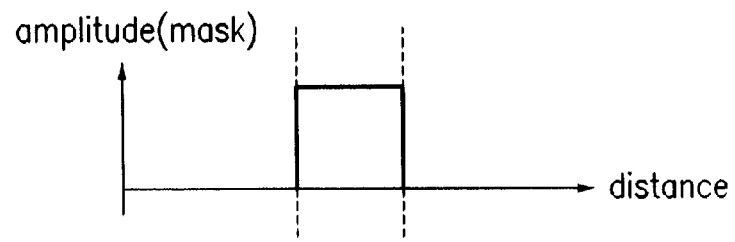
Figure 1C:
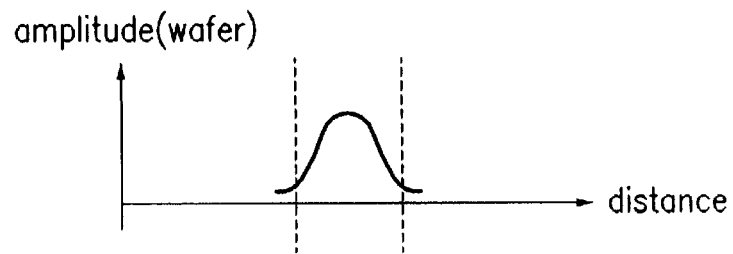
Figure 1D:
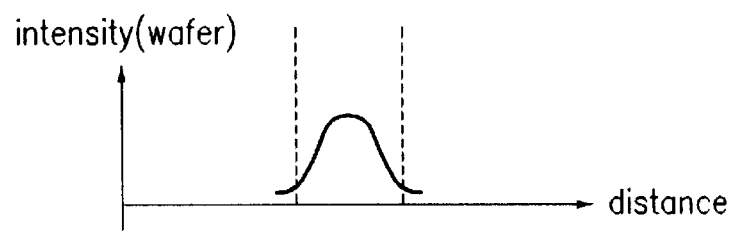
Figure 2A:
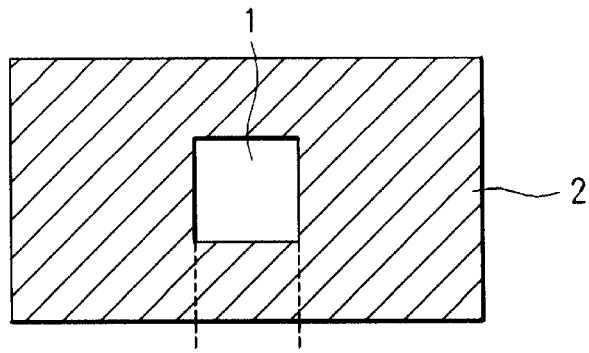
FIG. 2a is a plan view showing a general phase shift mask.
Figure 2B:
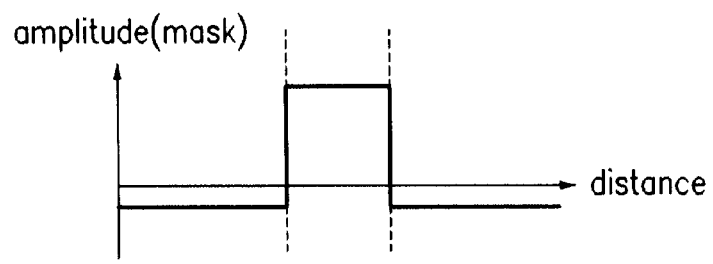
Figure 2C:
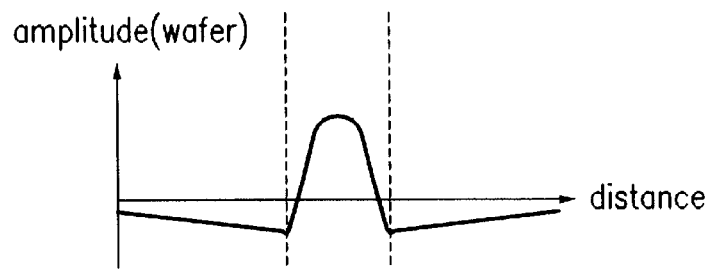
Figure 2D:
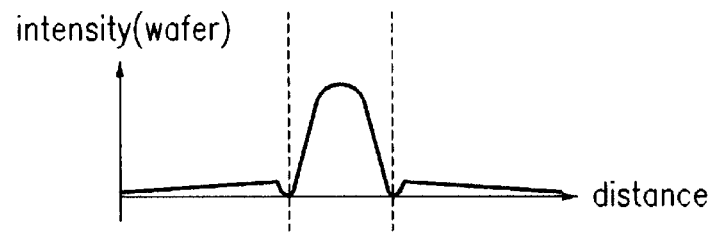
Figure 3:
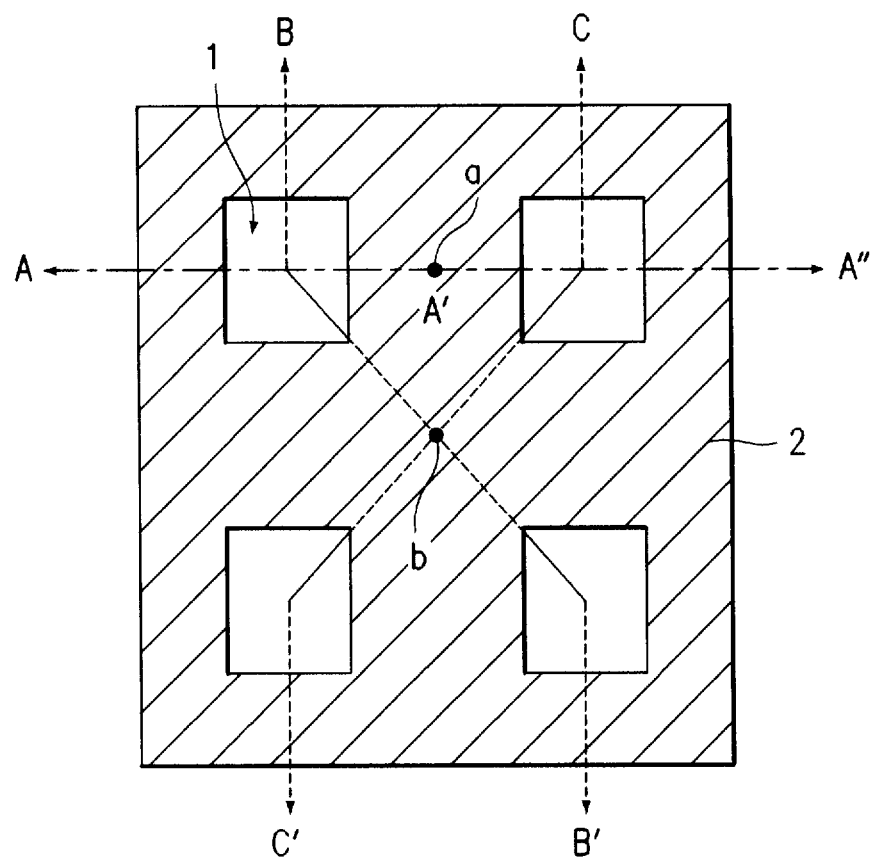
FIG. 3 is a plan view showing a conventional phase shift mask having a plurality of isolation patterns.
Figure 4A:
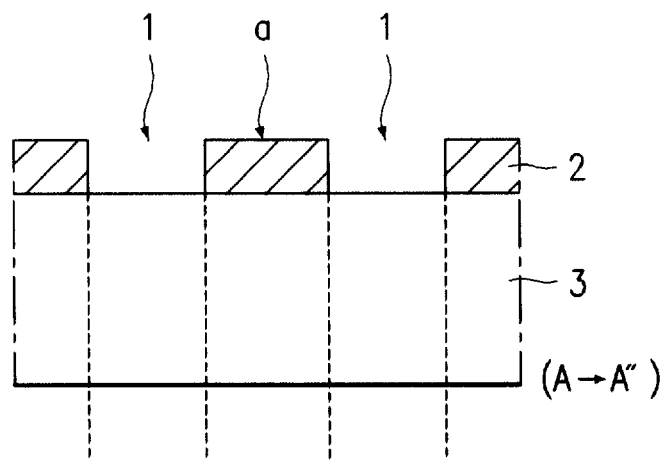
FIG. 4a is a sectional view showing the phase shift mask taken along line I–II" of FIG. 3.
Figure 4B:
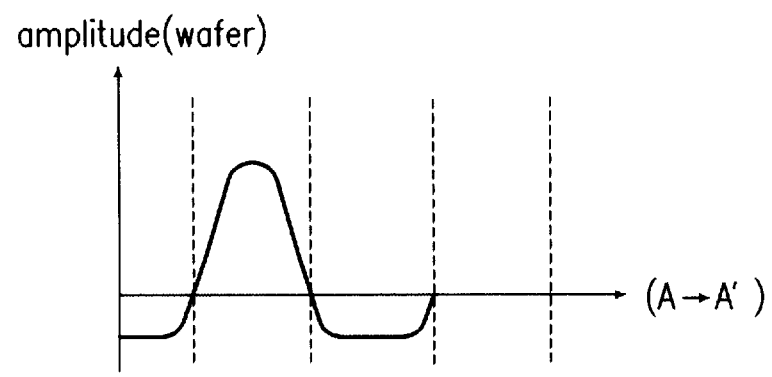
FIG. 4b represents a graph plotting an amplitude of light on a wafer after passing through the phase shift mask taken along line I—I' of FIG. 3.
Figure 4C:
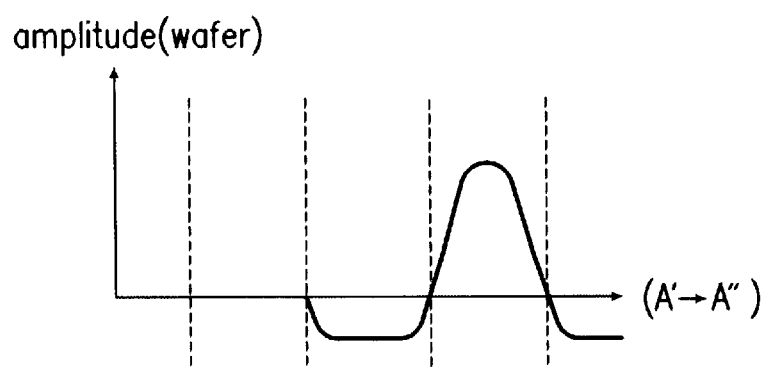
FIG. 4c represents a graph plotting an amplitude of the light on the wafer after passing through the phase shift mask taken along line I'—I" of FIG. 3.
Figure 4D:
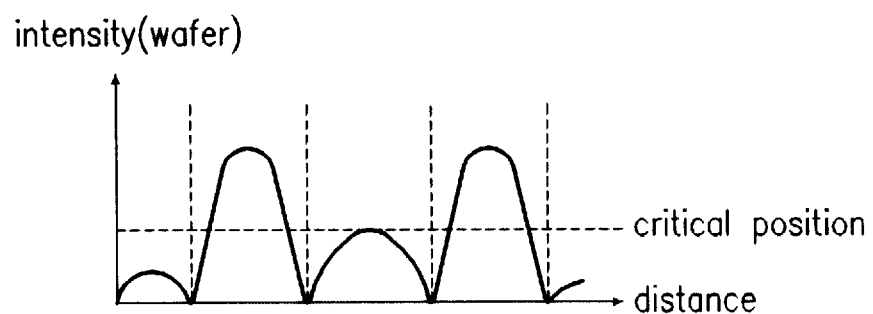
FIG. 4d represents a graph plotting an intensity of the light on the wafer after passing through the phase shift mask taken along line I—I" of FIG. 3.
Figure 5A:
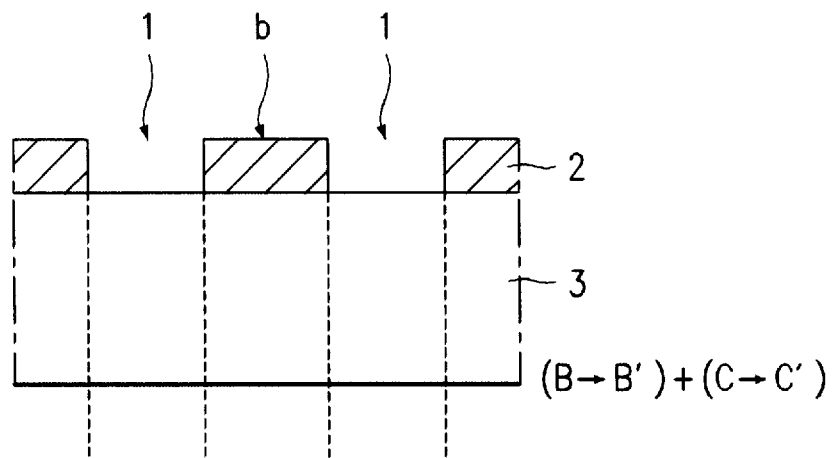
FIG. 5a is a sectional view showing the phase shift mask taken along line II—II' of FIG. 3.
Figure 5B:
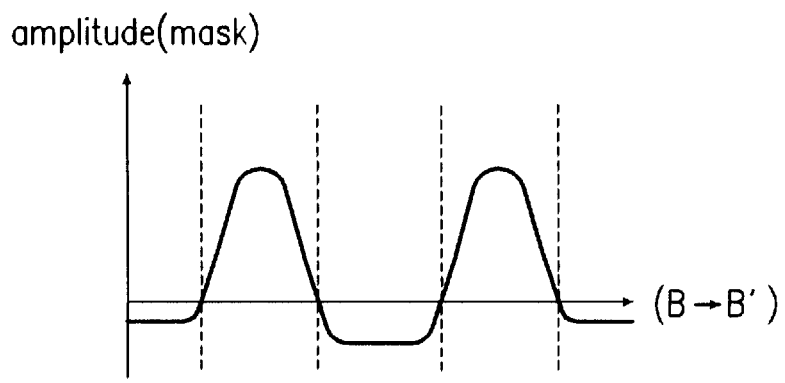
FIG. 5b represents a graph plotting the amplitude of the light on the wafer after passing through the phase shift mask taken along line II—II' of FIG. 3.
Figure 5C:
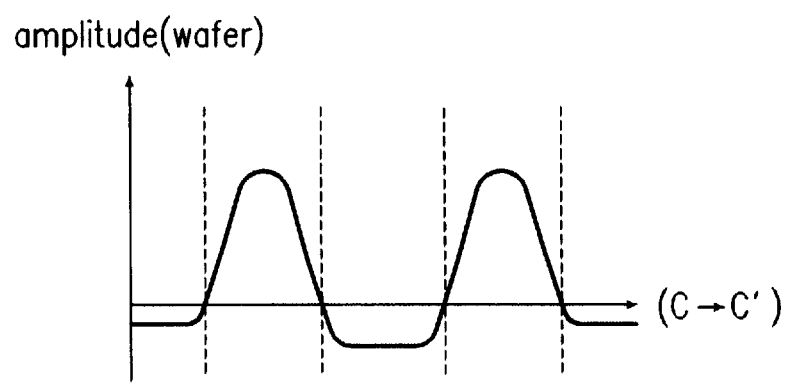
FIG. 5c represents a graph plotting the amplitude of the light on the wafer after passing through the phase shift mask taken along line III—III' of FIG. 3.
Figure 5D:
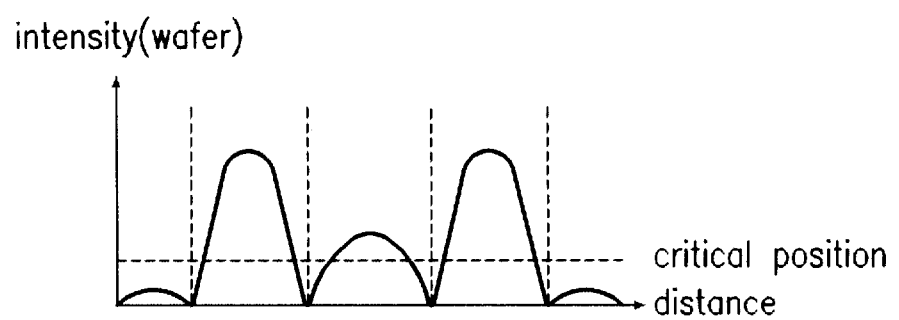
FIG. 5d represents a graph obtained by adding the intensity of the light on the wafer after passing through the phase shift mask taken along line II—II' of FIG. 3 to the intensity of the light on the wafer after passing through the phase shift mask taken along line III—III" of FIG. 3.
Figure 7:
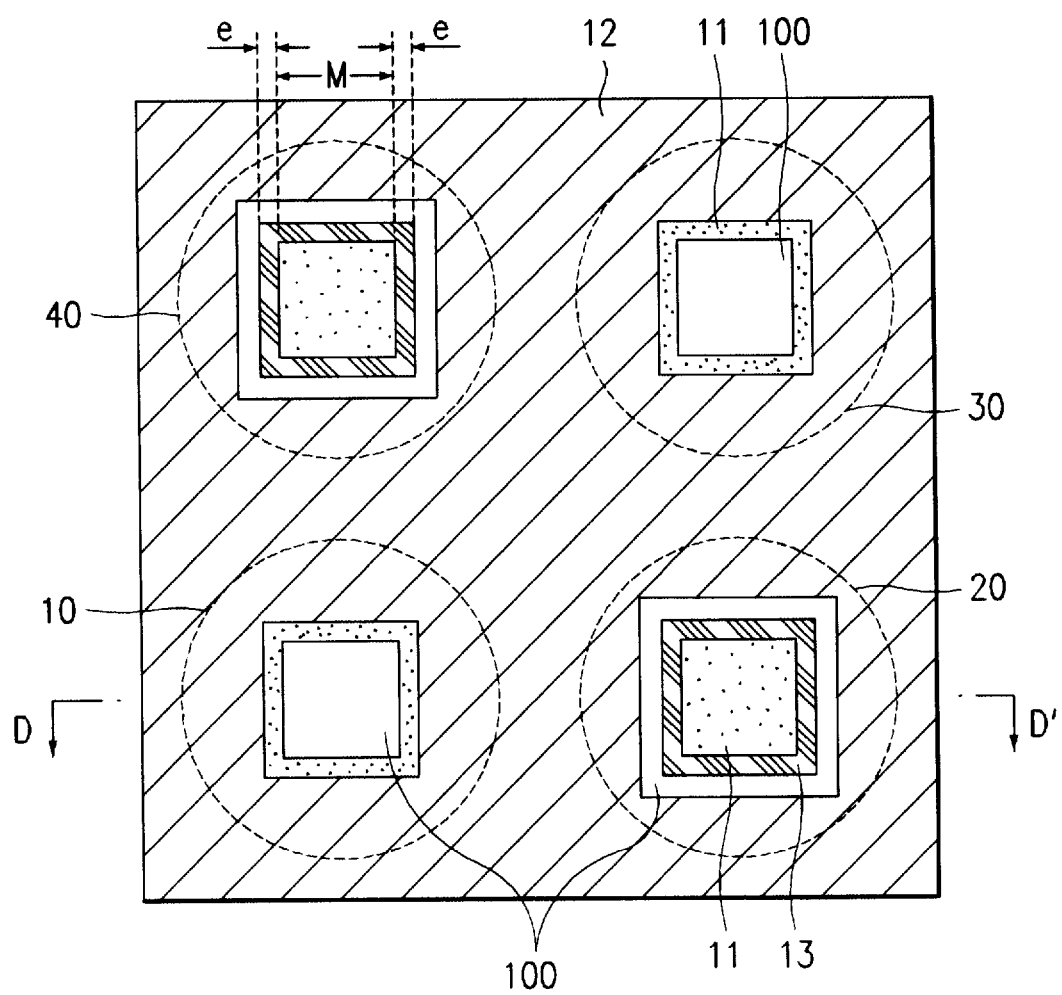
FIG. 7 is a plan view showing a first embodiment of a phase shift mask according to the present invention.

FIG. 7 is a plan view showing a first embodiment of a phase shift mask according to the present invention.

As shown in FIG. 7, the phase shift mask according to the first embodiment of the present invention includes a transparent substrate 100, and a first rim type mask portion 10 formed on transparent substrate 100. A first outrigger type mask portion 20 is formed on transparent substrate 100 spaced apart from first rim type mask portion 10 by a predetermined distance. A second rim type mask portion 30 is formed on transparent substrate 100 in the diagonal direction to first rim type mask portion 10, and a second outrigger type mask portion 40 is formed on transparent substrate 100 in the diagonal direction to first outrigger type mask portion 20. Respective rim type mask portions 10 and 30 include a phase shift layer 11 having an open area on transparent substrate 100 and a half-tone phase shift layer 12 formed on phase shift layer 11 and having an open area larger than that of phase shift layer 11. Respective outrigger type mask portions 20 and 40 include a phase shift layer 11 having an island including a main portion M and an edge portion e on transparent substrate 100, a half-tone phase shift layer 12 formed on phase shift layer 11 excluding the main portion M, and a shielding layer pattern 13 formed on half-tone phase shift layer 12 placed within the island. The shielding layer pattern 13 has a shape of a hollowed rectangular pole formed of a chrome (Cr) layer.

Here, transparent substrate 100 is a glass substrate. A distance between the centers of the rim type mask portion and outrigger type mask portion ranges within $$0.8 \frac{\lambda}{N \cdot A} \sim 2.2 \frac{\lambda}{N \cdot A}.$$

where a reference symbol λ denotes wavelength of light, and N•A is a numerical aperture.

Hereinbelow, a process of manufacturing the phase shift mask according to the first embodiment of the present invention will be described with reference to FIGS. 8a to 8i and 9a to 9i.

Figure 8A:
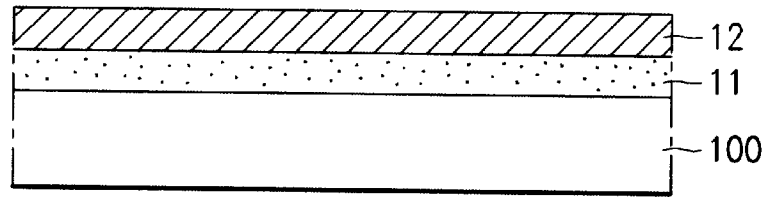
FIGS. 8a to 8i are sectional views for illustrating a process of manufacturing the phase shift mask taken along line IV—IV' of FIG. 7.
Figure 9A:
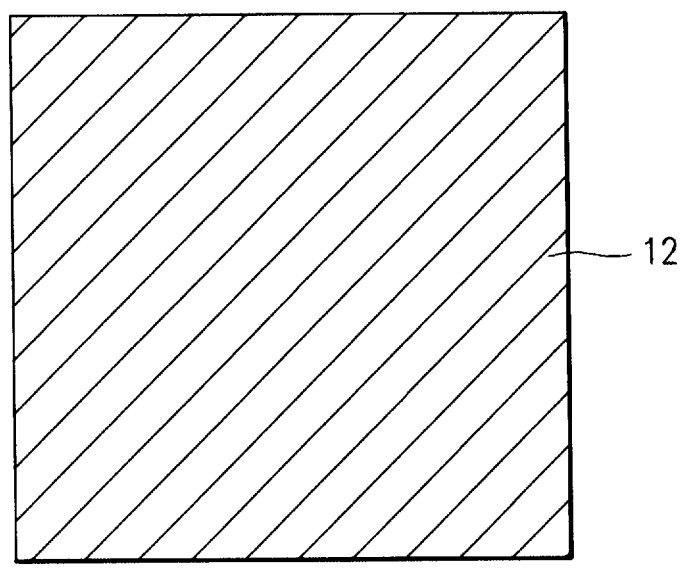
FIGS. 9a to 9i are plan views for illustrating the process of manufacturing the phase shift mask shown in FIG. 7.

As shown in FIGS. 8a and 9a, phase shift layer 11 and half-tone phase shift layer 12 are sequentially formed on transparent substrate 100 such as glass. The transmission factor of halftone phase shift layer 12 is about 4~30%, and that of phase shift layer 11 with respect to the light is 80~100%.

Figure 8B:
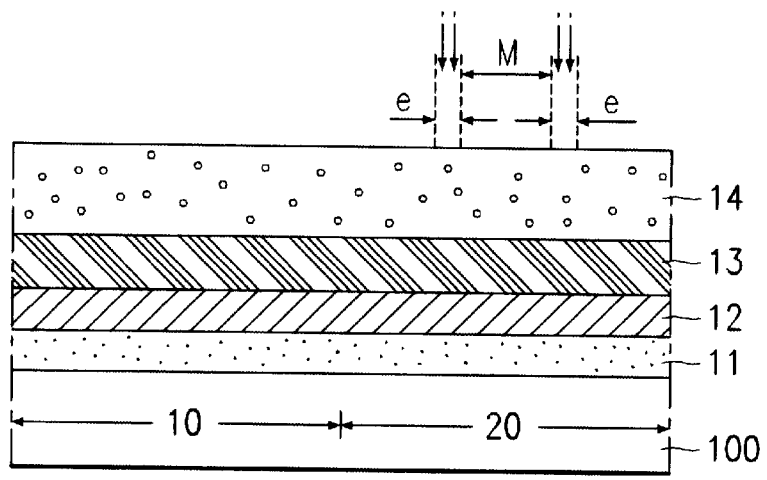
Figure 9B:
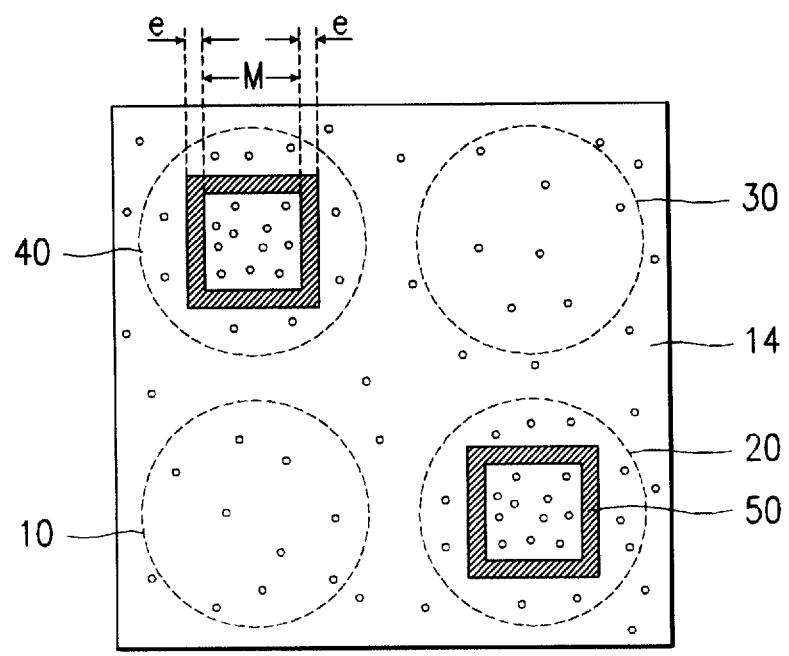

Referring to FIGS. 8b and 9b, transparent substrate 100 is classified into outrigger type phase shift mask portions 20 and 40 and rim type phase shift mask portions 10 and 30. Then, a shielding layer 13 and a photoresist 14 for exposure to an electron beam are formed on half-tone phase shift layer 12. Thereafter, the electron beam is selectively radiated to define a shielding layer pattern forming region (here, an oblique-lined portion denoted by a reference numeral 50 (FIG. 9b) illustrates the electron beam radiating area on the plan view).

At this time, the chrome layer having an absorption factor of more than 96% with respect to the exposure wavelength is formed as shielding layer 13. The shielding layer pattern forming area is edge portion e of phase shift layer 11, which is in the form of an island that will be processed in the succeeding process. A portion within the shielding layer pattern forming area excluding the shielding layer pattern forming area itself is main portion M of the island-shaped phase shift layer 11 and is to be used as a penetrating area.

Figure 8C:
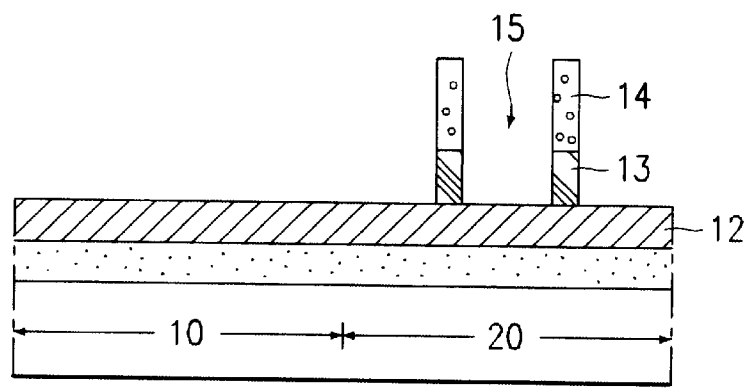
Figure 9C:
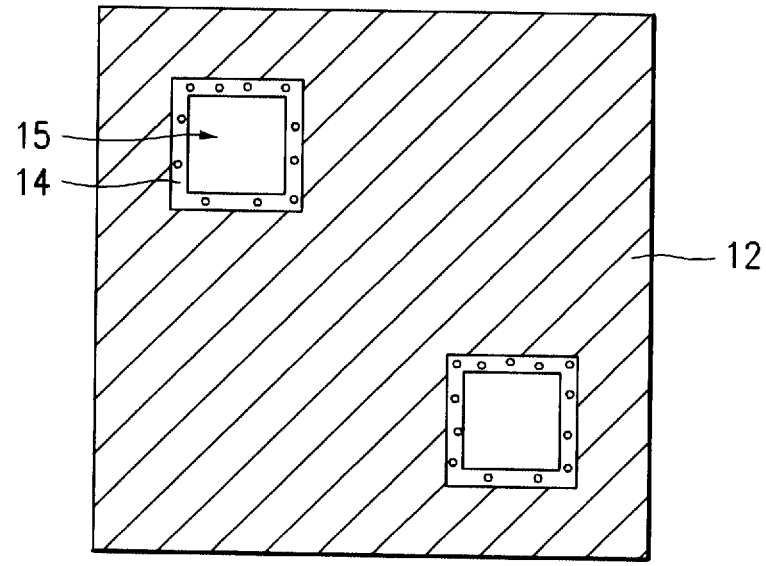

As shown in FIGS. 8c and 9c, photoresist 14 is exposed to electron beam and developed. Then, shielding layer pattern 13 is selectively removed, using photoresist pattern 14 as a mask, to form shielding layer pattern 13 having rectangular hole 15. Here, shielding layer pattern shaped as a hollow rectangular pole.

Shielding layer pattern 13 is for forming the outrigger type phase shift mask in which the phase shift mask is provided such that a hole is formed within the rectangular shielding layer and the phase at the portion where the hole is formed is opposite to the phase at the outer portion of the shielding layer after the light transmission.

Figure 8D:
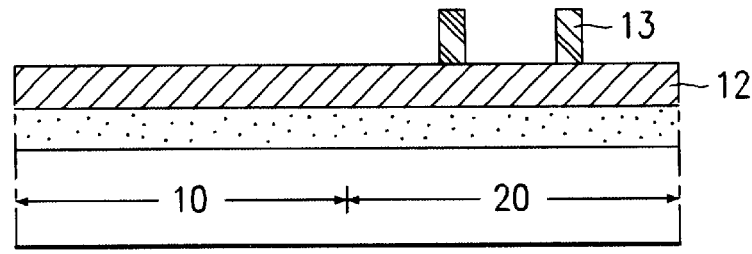
Figure 9D:
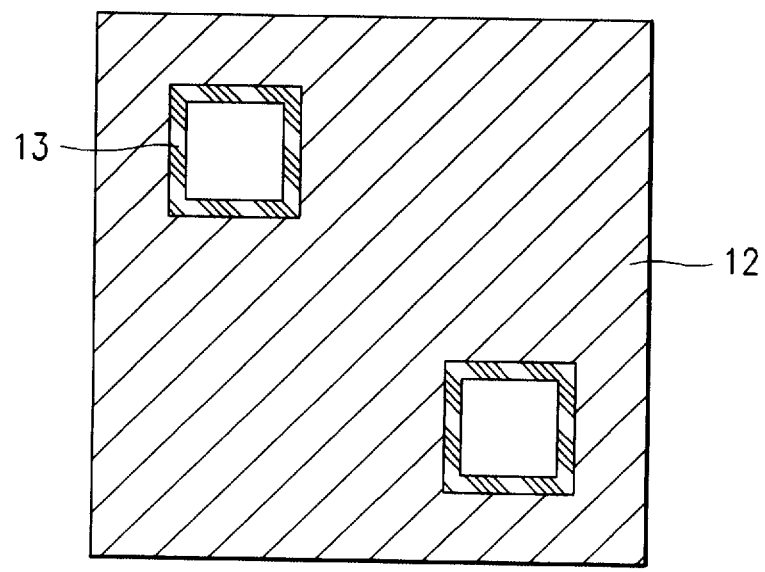

Referring to FIGS. 8d and 9d, photoresist 14 on shielding layer pattern 13 is removed.

Figure 8E:
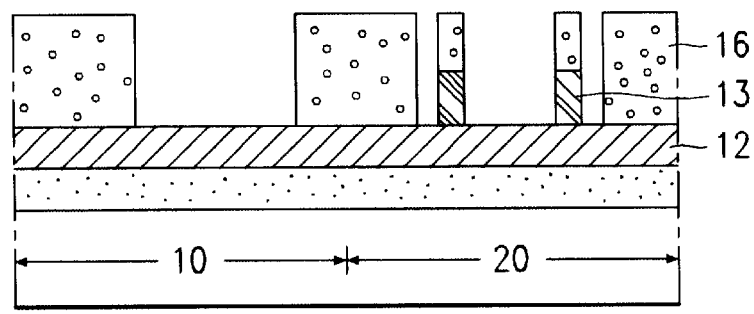
Figure 9E:
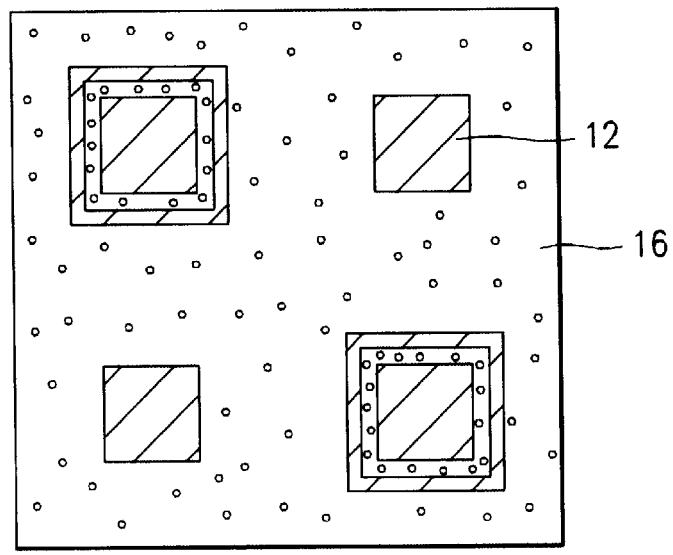

As shown in FIGS. 8e and 9e, a photoresist 16 for exposure to electron beam is formed on the whole surface of half-tone phase shift layer 12 and shielding layer pattern 13. Thereafter, photoresist 16 is patterned (via photolithography and etching process) to selectively remove photoresist 16 formed in hole 15 of outrigger type phase shift mask portions 20 and 40 and photoresist 16 outside shielding layer pattern 13, thereby selectively exposing half-tone phase shift layer 12. Simultaneously, in rim type phase shift mask portions 10 and 30, photoresist 16 at a portion symmetrical to shielding pattern 13 is selectively removed, as shown in FIG. 8E. Here, the removed area is similar in size to that of shielding layer pattern 13 including hole 15.

Figure 8F:
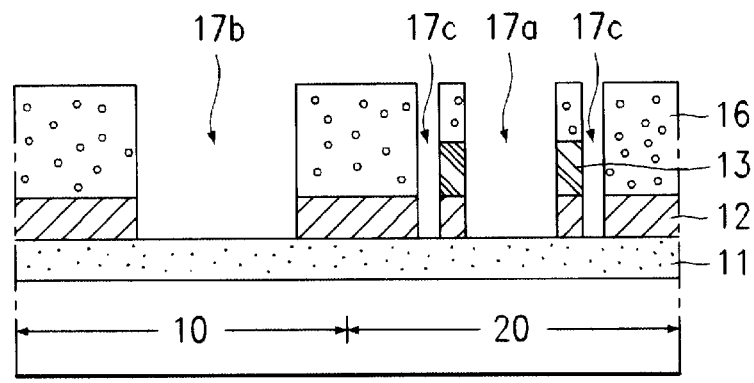
Figure 9F:
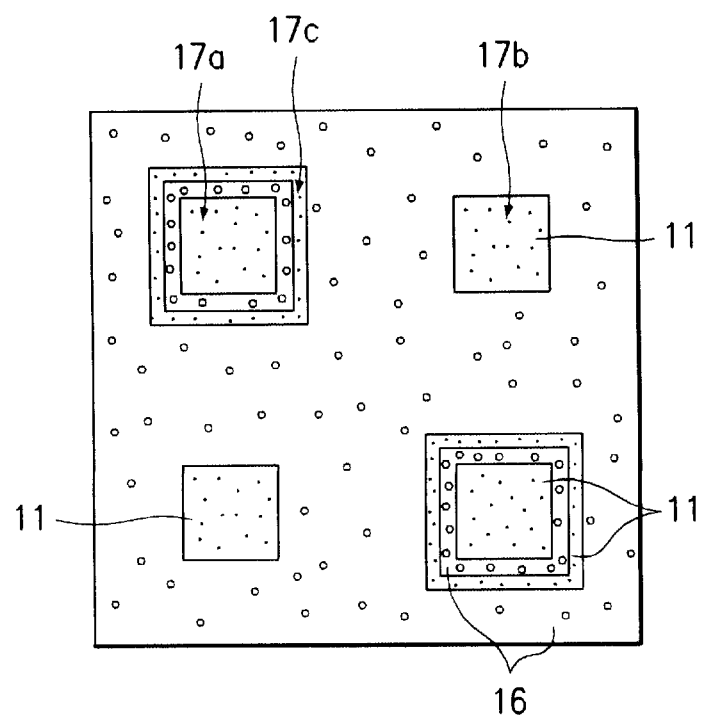

In FIGS. 8f and 9f, half-tone phase shift layer 12 is selectively removed by using photoresist pattern 16 as a mask to form open areas 17a, 17b and 17c.

Figure 8G:
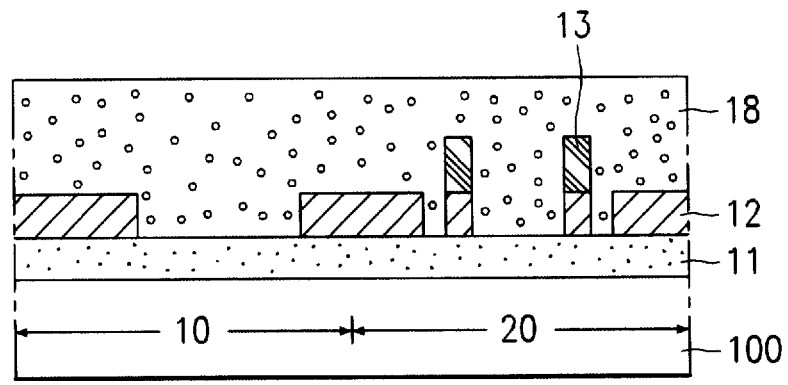
Figure 8H:
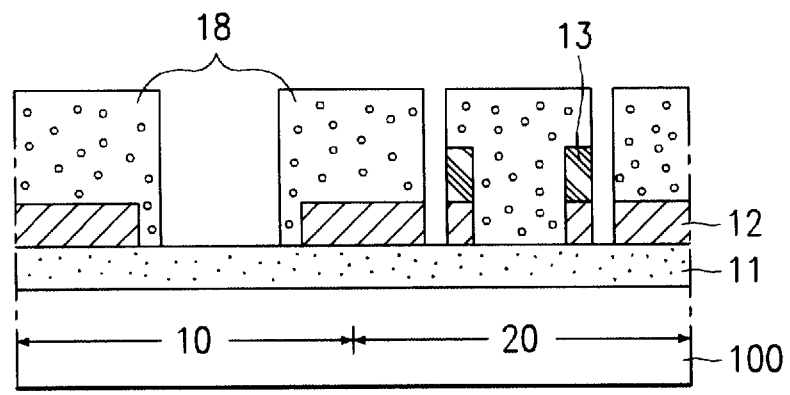
Figure 9G:
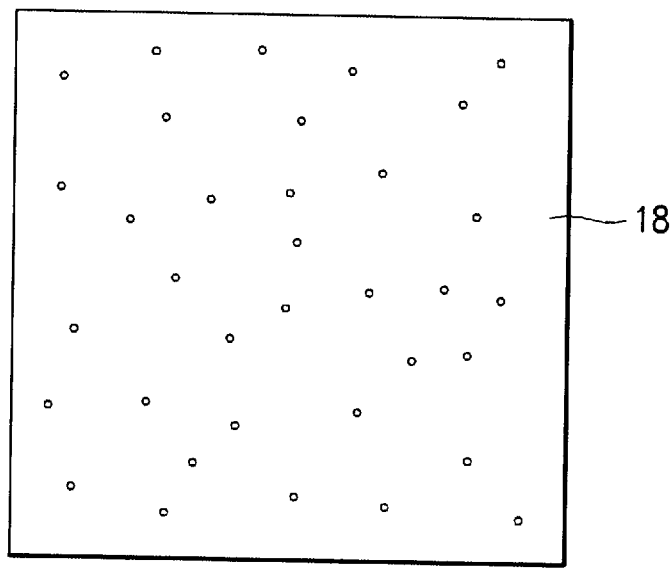
Figure 9H:
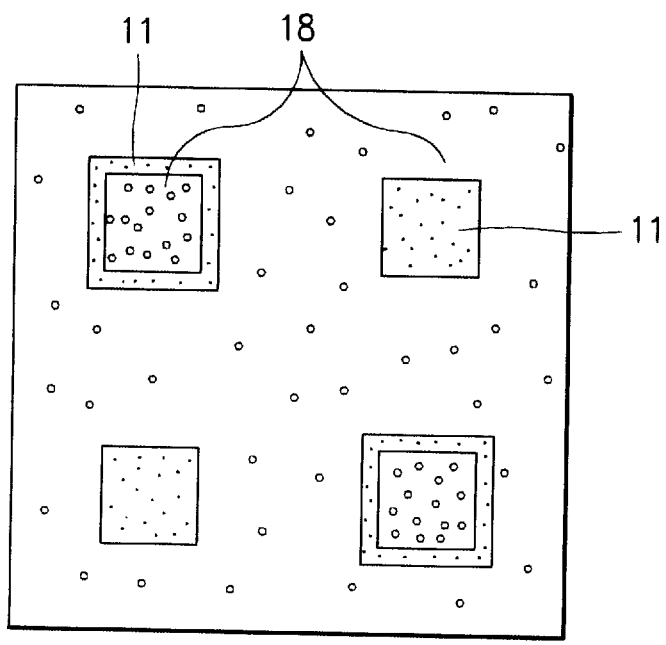

As shown in FIGS. 8g and 9g, photoresist pattern 16 is removed and photoresist 18 is deposited. Photoresist 18 at open area 17c (outer side of shielding layer pattern 13) is removed in outrigger type phase shift mask: portions 20 and 40 to expose phase shift layer 11, as shown as FIGS. 8H and 9H. In rim type phase shift mask portions 10 and 30, photoresist 18 corresponding to a portion narrower than open area 17b of rim type phase shift mask portions 10 and 30 to expose phase shift layer 11, as shown in FIGS. 8H and 9H.

Figure 8I:
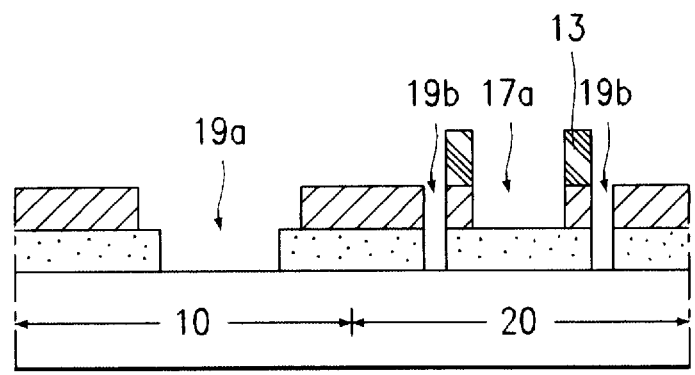
Figure 9I:
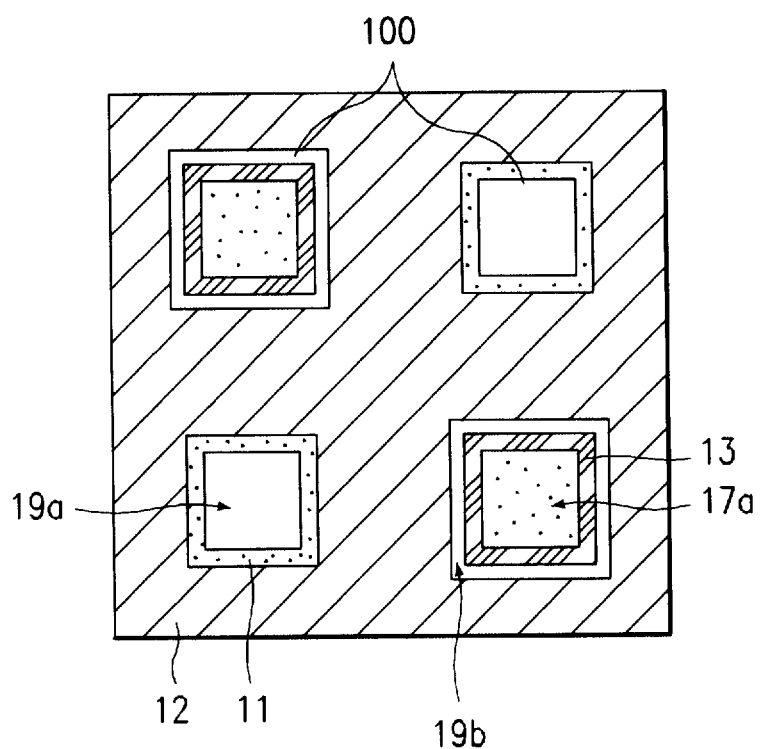

Referring to FIGS. 8i and 9i, exposed phase shift layer 11 is selectively removed by using photoresist pattern 18 as a mask to form open areas 19a and 19b.

At this time, island-shaped phase shift layer 11 is formed in outrigger type phase shift mask portions 20 and 40, and half-tone phase shift layer 12 and shielding layer pattern 13 are formed on edge portion e (see FIG. 7) of island-shaped phase shift layer 11. Phase shift layer 11 excluding edge portion e is formed with half-tone phase shift layer 12 and shielding layer pattern 13 on main portion M thereof. Phase shift layer 11 excluding edge portion e corresponds to main portion M which is the main penetrating area for actual resolution.

Also, the open area 19a formed within phase shift layer 11 is the main penetrating area for actual resolution in rim type phase shift mask portions 10 and 30.

The operation of the phase shift mask of the first embodiment according to the present invention will be described in more detail below.

Figure 10A:
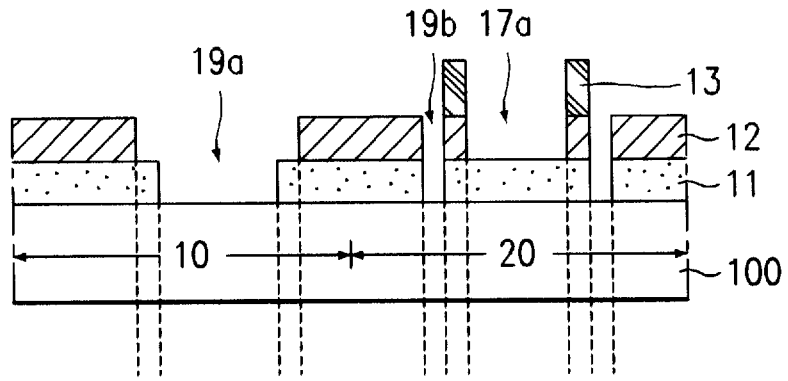
FIG. 10a is a sectional view showing the phase shift mask taken along line IV—IV' of FIG. 7.
Figure 10B:
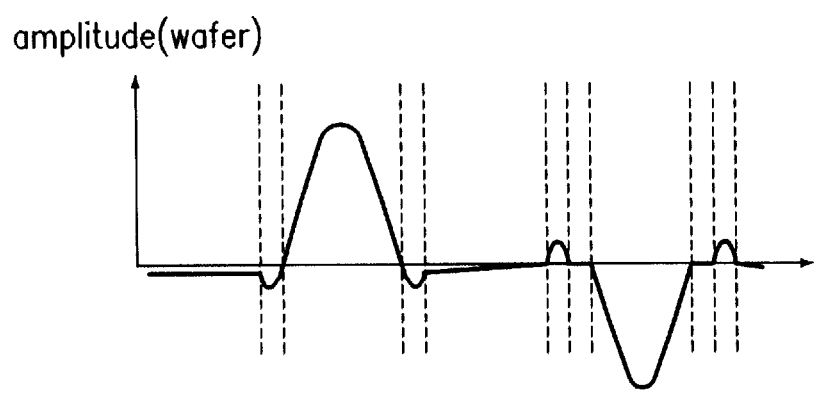
Figure 10C:
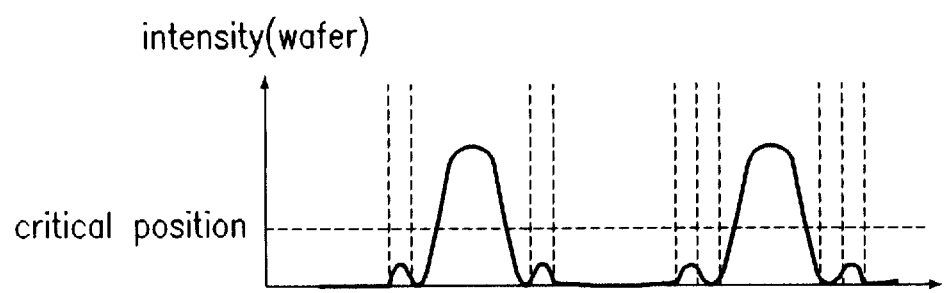

FIG. 10a is a sectional view showing the phase shift mask taken along line IV—IV' of FIG. 7, FIG. 10b represents a graph plotting an amplitude of the light on the wafer after passing through the phase shift mask shown in FIG. 10a, and FIG. 10c is a graph plotting an intensity of the light on the wafer after passing through the phase shift mask shown in FIG. 10a.

The amplitude of the light on the wafer after passing through the first embodiment of the phase shift mask according to the present invention, as shown in FIG. 10a, results in the phase shift of the light at the main penetrating areas 19a and 17a to be reversed. In addition, it can be noted that the side lobe of the light source having passed through the rim portion of rim type phase shift mask portion 10 is contrary to the side lobe having passed through penetrating area 19b of outrigger type phase shift mask portion 20, as shown in FIG. 10b.

FIG. 10c illustrates the side lobes offset from the central point between the isolation patterns not to exceed a threshold.

Figure 11:
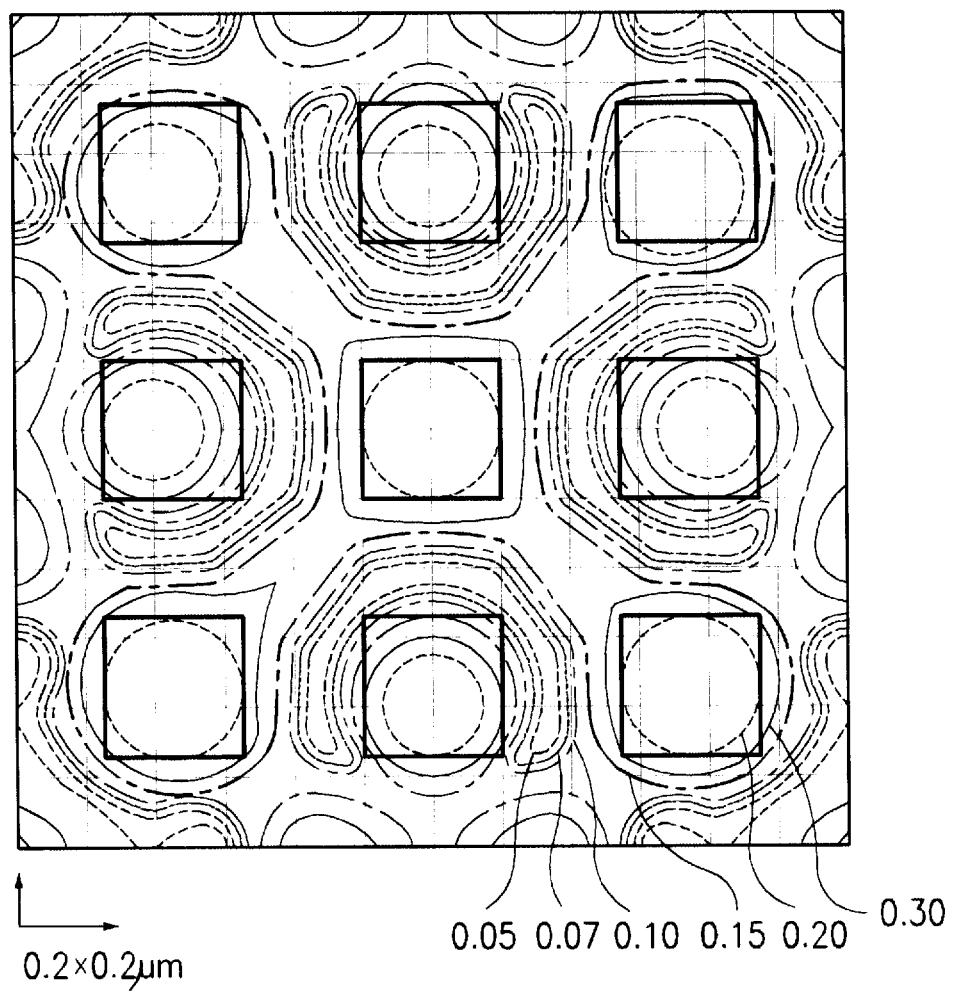
FIG. 11 shows light intensity distribution of the first embodiment of the phase shift mask according to the present invention.

FIG. 11 shows a result of simulating the light intensity distribution of the first embodiment of the phase shift mask according to the present invention evaluated by a hole of 0.4 $\mu m \times 0.4$ $\mu m$ and 1:1 pitch. The test is executed under the following: exposure condition of i-line, a numerical aperture of 0.52, a coherence factor $\sigma$ of 0.5, and a transmission factor of the half-tone phase shift layer of 8%. These are isolation patterns in this instance. When the light intensity is sequentially represented from 0.8 to 0, a light intensity having a distribution of 0.3 to 0.05 is formed at the isolation pattern (thick solid-lined portion) and around the isolation pattern.

Here, all vertically and horizontally adjacent isolation patterns have opposite phases with respect to one another to inversely form the phases from the diffraction of the light source transmitted between the isolation patterns. Thus, the side lobes offset each other at the overlapping portion of the isolation patterns. Furthermore, increasing the light intensity does not produce an abnormal pattern by the side lobe.

Now, a phase shift mask of the second embodiment according to the present invention will be described with reference to FIGS. 12 to 16.

In the second embodiment of the present invention, an auxiliary mask portion 60 is formed where respective isolation patterns, i.e., first rim type phase shift mask portion 10, first outrigger type phase shift mask portion 20, second rim type phase shift mask portion 30, and second outrigger type phase shift mask portion 40, overlap one another in the diagonal direction in the structure of the first embodiment of the present invention.

More specifically, since side lobes having phases of the same amplitude may appear at the diagonally overlapping portions of respective isolation patterns, auxiliary mask 60 including four areas 61 and 62 shaped as a checker board is formed at a portion where four isolation patterns diagonally overlap one another to offset the side lobes.

Hereinbelow, the process for manufacturing the phase shift mask of the second embodiment: according to the present invention will be described with reference to FIGS. 13a to 13e and FIGS. 14a to 14e.

At this time, the process for forming shielding layer pattern 13 on half-tone phase shift layer 12 is identical to that as shown in FIGS. 8d and 9d, as explained in the first embodiment.

Figure 13A:
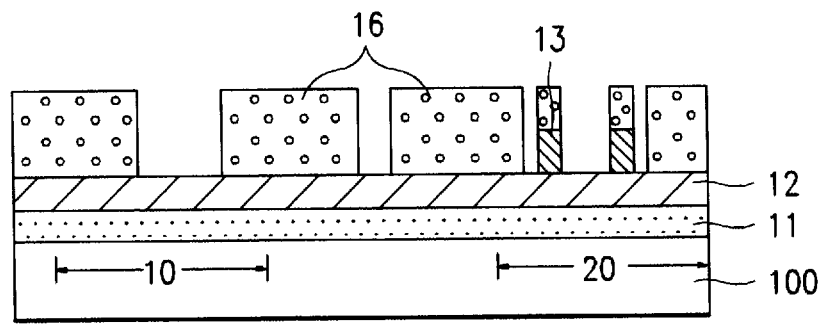
FIGS. 13a to 13e are sectional views for illustrating a process of manufacturing the phase shift mask taken along line V—V' of FIG. 12.
Figure 14A:
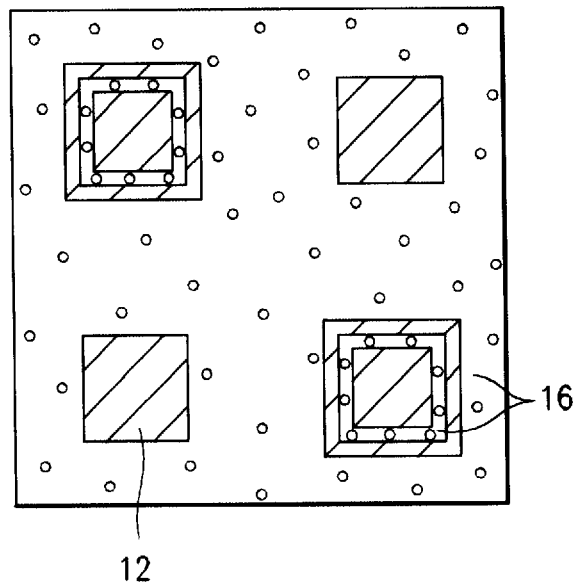
FIGS. 14a to 14e are plan views for illustrating the process of manufacturing the phase shift mask shown in FIG. 12.

Then, as shown in FIGS. 13a and 14a, photoresist 16 for exposure to electron beam is formed on the whole surface of half-tone phase shift layer 12 and shielding layer pattern 13. Photoresist 16 is patterned (via photolithography and etching process) to selectively remove the photoresist 16 formed in hole 15 of outrigger type phase shift mask portions 20 and 40 and at an outer side portion of shielding layer pattern 13, thereby selectively exposing half-tone phase shift layer 12.

Simultaneously, in rim type phase shift mask portions 10 and 30, photoresist 16 formed to be symmetrical to shielding layer pattern 13 is selectively removed, as shown in FIG. 13a. Here, the amount of removed area is similar to that of shielding layer pattern 13 including hole 15.

Successively, photoresist 16 on a portion where rim type phase shift mask portions 10 and 30 and outrigger phase shift mask portions 20 and 40 diagonally overlap one another is selectively removed.

Figure 13B:
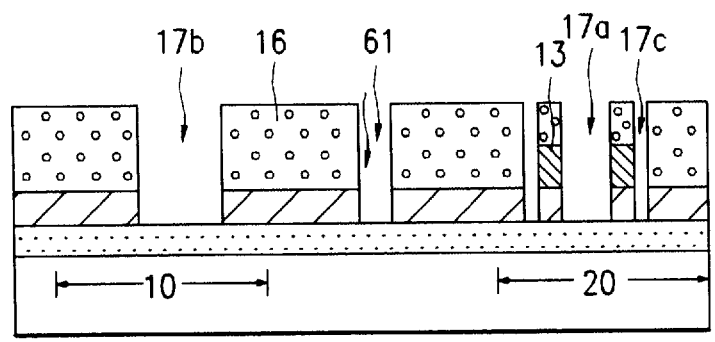
Figure 14B:
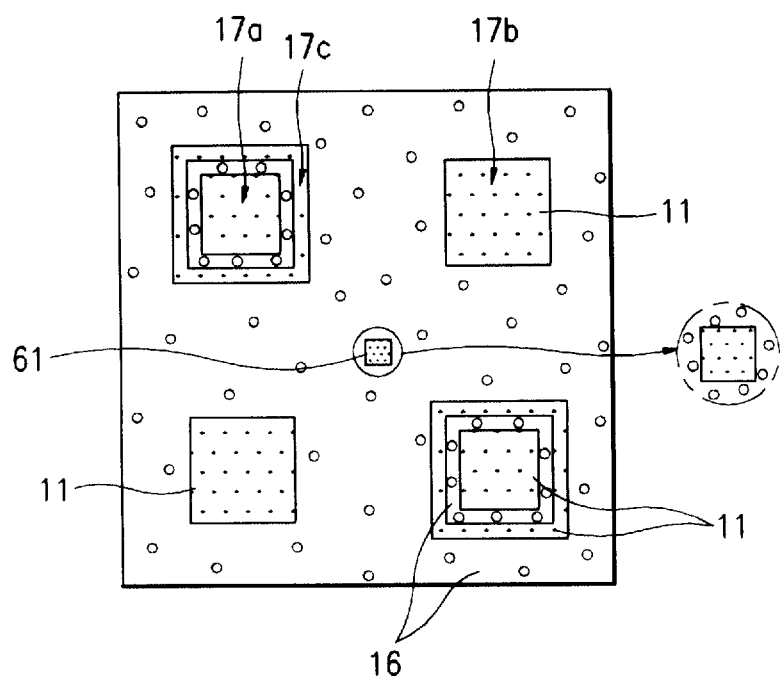

As shown in FIGS. 13b and 14b, half-tone phase shift layer 12 is selectively removed using photoresist pattern 16 as a mask to form open areas 17a, 17b and 17c. Also, a first auxiliary penetrating portion 61, which is an open area, is formed where rim type phase shift mask portions 10 and 30 and outrigger type phase shift mask portions 20 and 40 diagonally overlap one another.

Figure 13C:
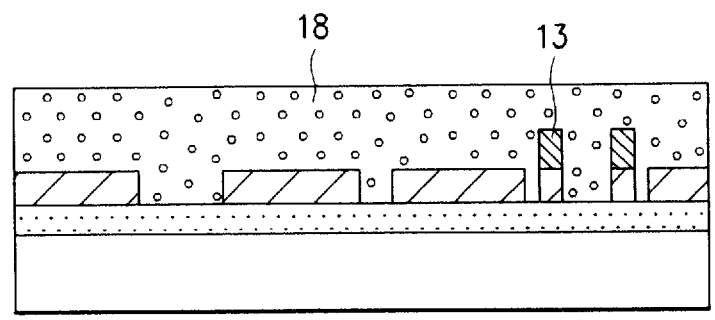
Figure 14C:
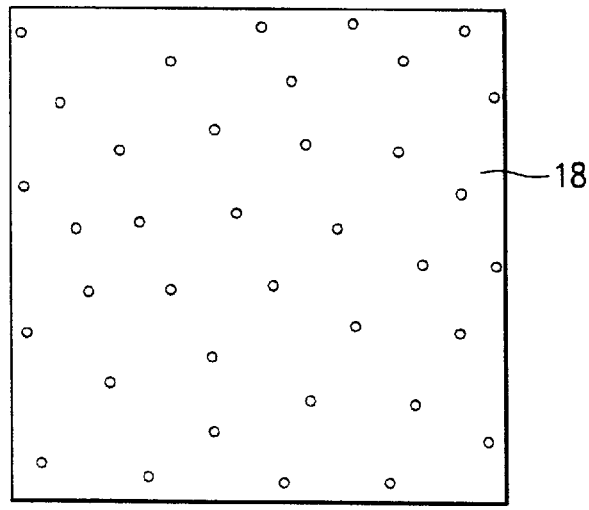

Referring to FIGS. 13c and 14c, photoresist pattern 16 is removed, and photoresist 18 for exposure to electron beam is deposited on the whole surface of resultant structure.

Figure 13D:
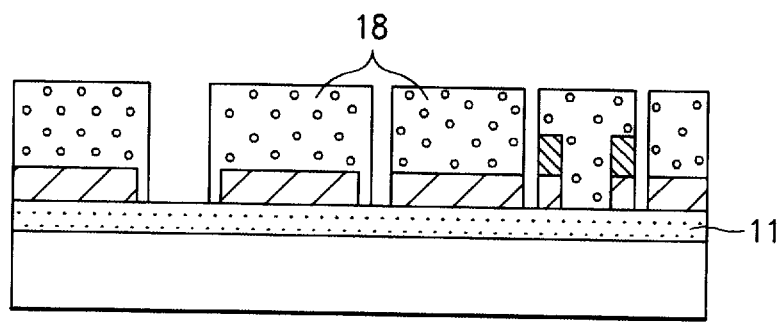
Figure 14D:
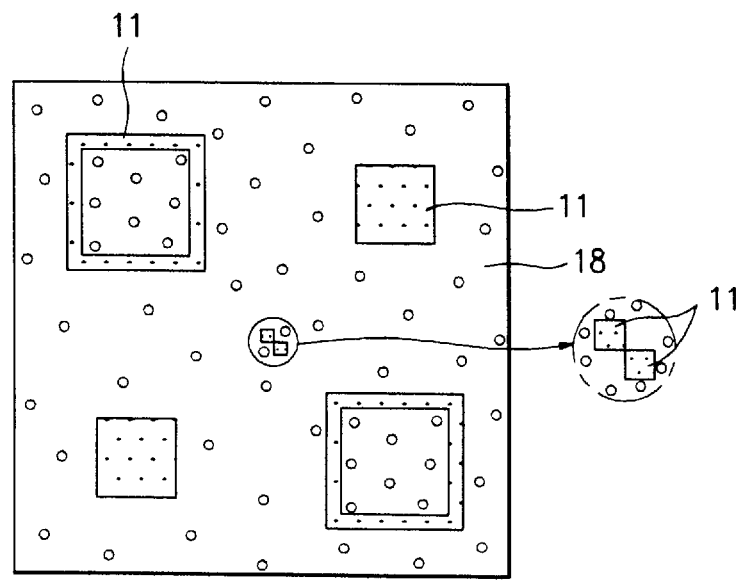

As shown in FIGS. 13d and 14d, photoresist 18 is patterned to expose open area 17c which is provided outside of shielding layer pattern 13 in outrigger type phase shift mask portions 20 and 40. In rim type phase shift mask portions 10 and 30, a portion of the photoresist 18 that is narrower than open area 17a is removed, thereby exposing phase shift layer 11.

Photoresist 18 formed at first auxiliary penetrating portion 61 where outrigger phase shift mask portions 20 and 40 overlap with each other is defined as a fourth area.

Subsequently, photoresist 18 corresponding to a second area in the vicinity of outrigger type phase shift mask portions 20 and 40 is selectively removed.

Figure 13E:
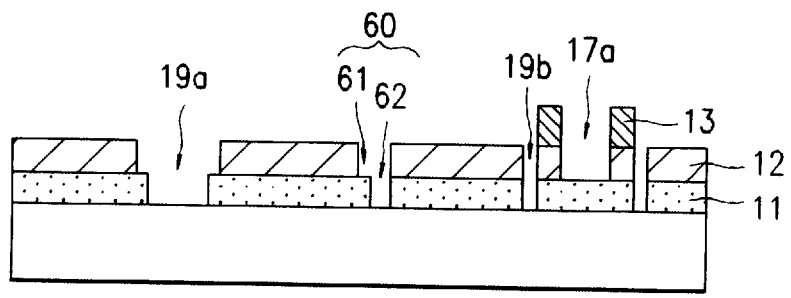
Figure 14E:
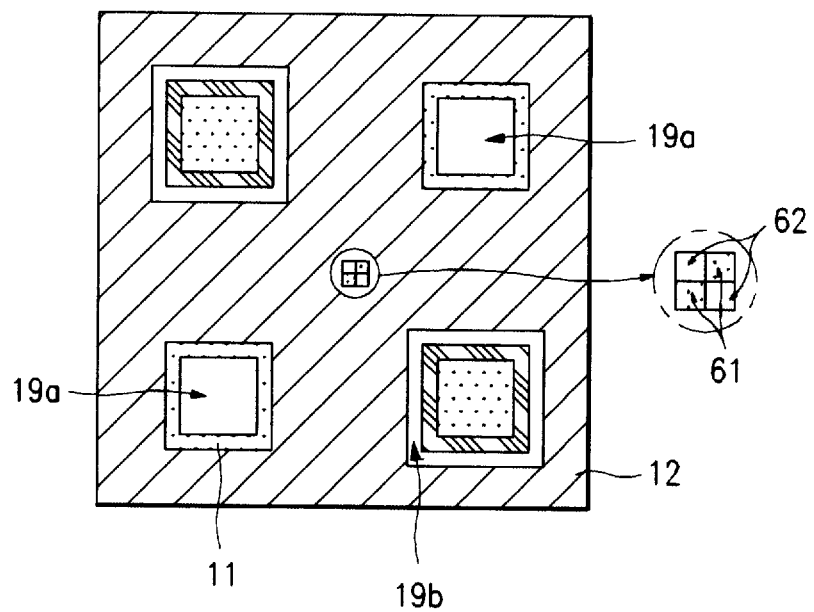

Referring to FIGS. 13e and 14e, exposed phase shift layer 11 is selectively etched to form open areas 19a and 19b, using photoresist pattern 18 as a mask.

A second auxiliary penetrating portion 62 is formed where the phase shift masks of two types diagonally overlap with each other to form auxiliary mask portion 60, which includes first auxiliary penetrating portion 61 and second auxiliary penetrating portion 62 in the form of a checker board. That is, the auxiliary mask portion 60 is formed where respective isolation patterns diagonally overlap one another to transmit the main phase and opposite phase of the light source having passed through respective isolation patterns.

The operation of the second embodiment of the present invention will be described in detail with reference to FIGS. 15a through 16c.

Figure 12:
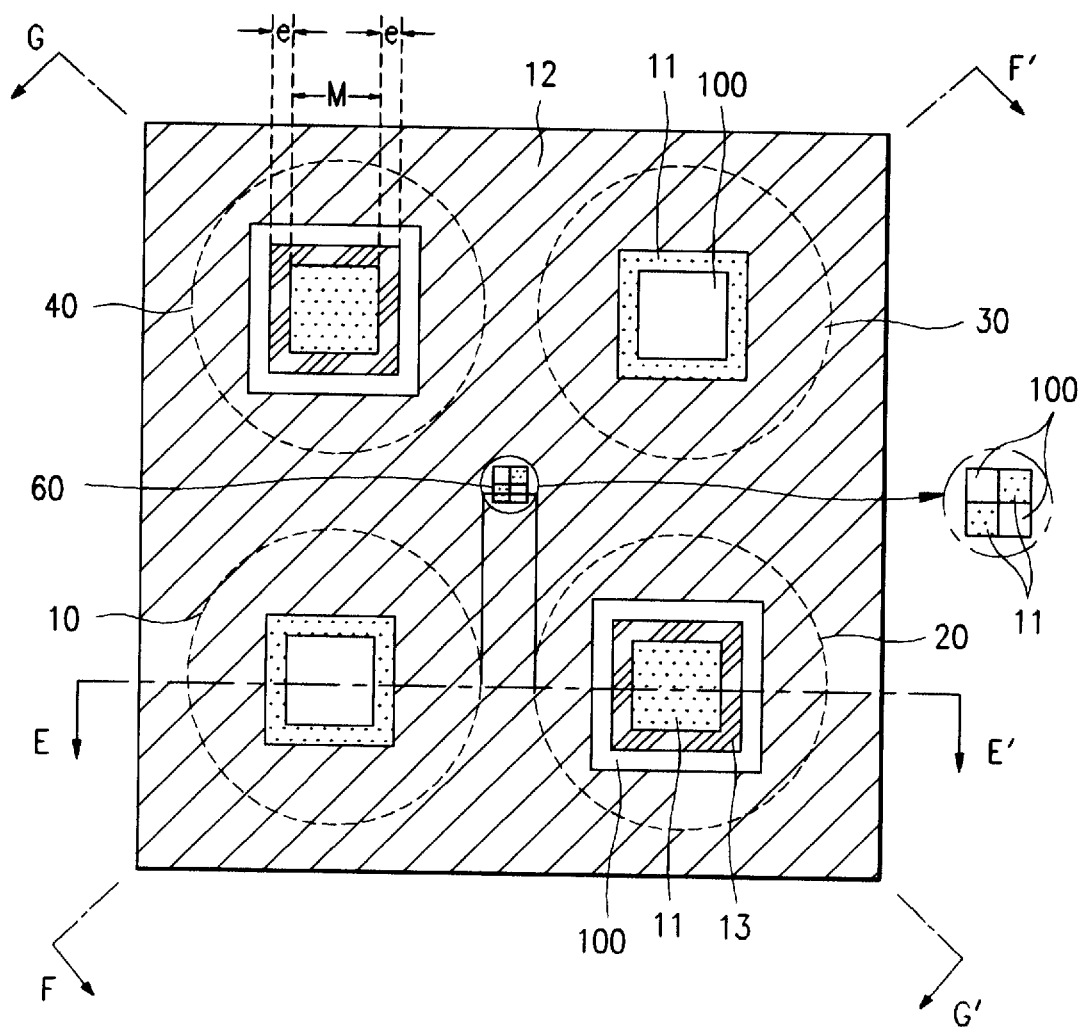
FIG. 12 is a plan view showing a second embodiment of the phase shift mask according to the present invention.
Figure 15A:
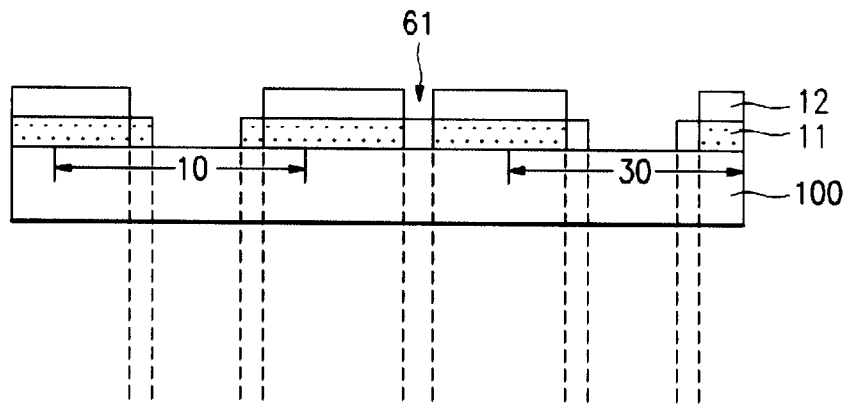
FIG. 15a is a sectional view showing the phase shift mask taken along line VI—VI' of FIG. 12.
Figure 15B:
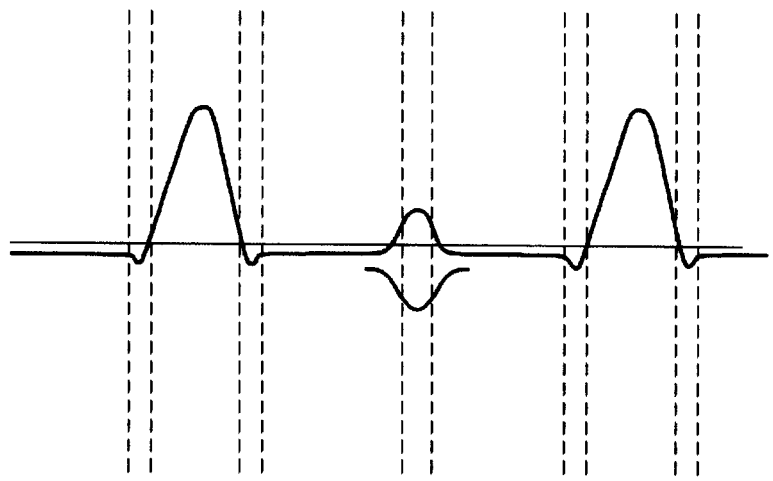
Figure 15C:
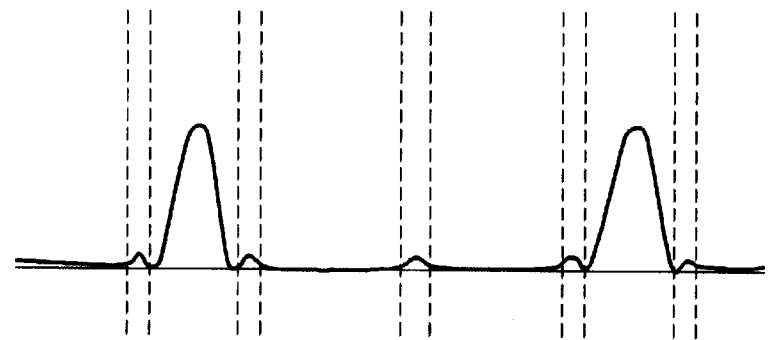

FIG. 15a is a sectional view showing the phase shift mask taken along line VI—VI' of FIG. 12, FIG. 15b represents a graph plotting the amplitude of the light on the wafer after passing through the phase shift mask shown in FIG. 15a, and FIG. 15c is a graph representation plotting the intensity of the light on the wafer after passing through the phase shift mask shown in FIG. 15a.

Figure 16A:
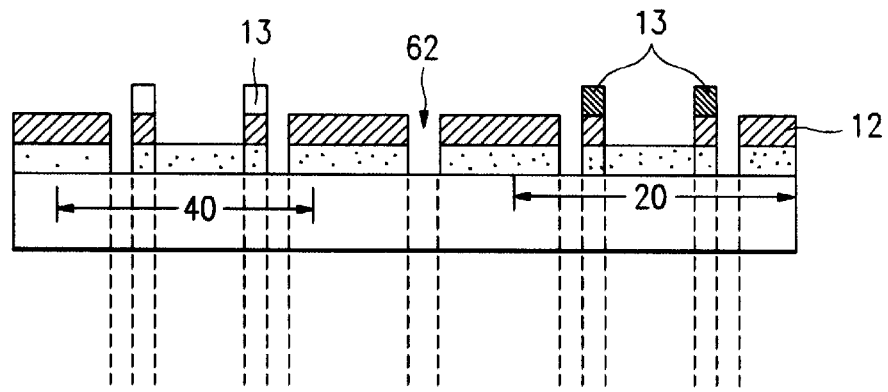
FIG. 16a is a sectional view showing the phase shift mask taken along line VII—VII' of FIG. 12.
Figure 16B:
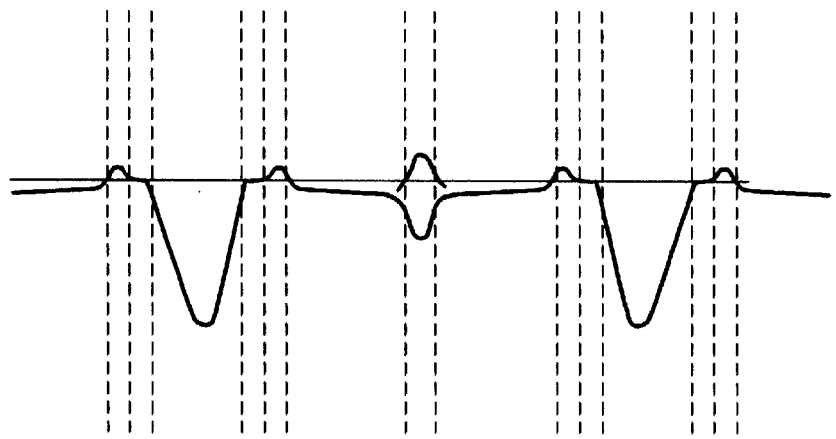
Figure 16C:
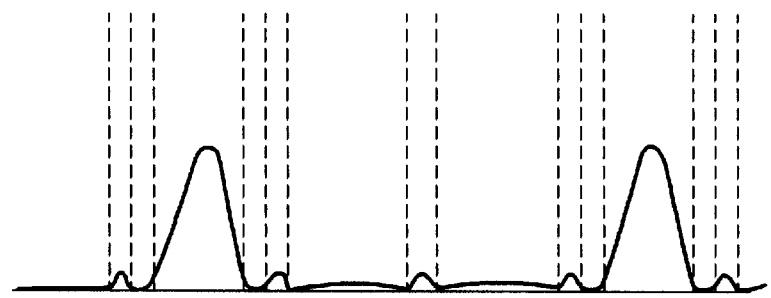

FIG. 16a is a sectional view showing the phase shift mask taken along line VII—VII' of FIG. 12, FIG. 16b represents a graph plotting the amplitude of the light on the wafer after passing through the phase shift mask shown in FIG. 16a, and FIG. 16c is a graph representation plotting the intensity of the light on the wafer after passing through the phase shift mask shown in FIG. 16a.

As shown in FIG. 15a, the main phase of light having passed through first rim type phase shift mask portion 10 and the main phase of light having passed through second rim type phase shift mask 30 are 0°. Thus, half tone phase shift layer 12 is selectively removed to incite the phase shift of 180° where two mask portions overlap with each other, thereby forming first auxiliary mask portion 61. Consequently, the amplitudes with respect to the light oppose each other as shown in FIG. 15b. The light intensity on the wafer is offset in the overlapping portion as shown in FIG. 15c.

In FIG. 16a, the main phase of light having passed through second outrigger type mask portion 40 and the main phase of light having passed through first outrigger type phase shift mask portion 20 are 180°. Therefore, half tone phase shift layer 12 and phase shift layer 11 are selectively removed to have a phase of 0° where two mask portions overlap with each other, thereby forming second auxiliary mask portion 62.

As shown in FIG. 16b, the amplitudes with respect to the light oppose each other in the overlapping portion. Thus, the light intensity on the wafer is offset at the diagonally overlapping portion of outrigger type phase shift mask portions 20 and 40 as shown in FIG. 16c to prevent the formation of an abnormal pattern.

Accordingly, the phase shift mask of the present invention offsets side lobes produced from a half-tone phase shift layer, as described above. Moreover, the present invention has the following advantages and effects.

First, since the phases of the light having transmitted through adjacent isolation patterns are opposite to each other, side lobes having opposite phases are offset at the overlapping portion of respective isolation patterns, thereby preventing the formation of an abnormal pattern.

Second, when the light intensity is reinforced, the side lobes having the opposite phases are produced to prevent the abnormal pattern caused by the side lobe.

Third, the light intensity can be increased to improve resolution and depth of focus.

Fourth, the auxiliary penetrating areas are additionally provided at the diagonally overlapping portions of the isolation patterns which are alternately formed in the vertical and horizontal directions to have different phases, thereby preventing the formation of an abnormal pattern caused by side lobes which may appear at the diagonally overlapping position.

It will be apparent to those skilled in the art that various modifications and variations can be made in the phase shift mask and method for manufacturing the same of the present invention without departing from the spirit or scope of the invention. Thus, it is intended that the present invention cover the modifications and variations of this invention provided they come within the scope of the appended claims and their equivalents

What is claimed is:

1. A phase shift mask device comprising:

a transparent substrate;

first and second rim masks on the transparent substrate, the first and second rim masks including a first phase shift layer, a second phase shift layer adjacent the first phase shift layer, and a light transparent portion adjacent the second phase shift layer, wherein the first rim mask has a diagonal relationship with respect to the second rim mask; and first and second outrigger masks on the transparent substrate each spaced from the first rim by a first distance, the first and second outrigger masks including a third phase shift layer, a fourth phase shift layer adjacent the third phase shift layer, a shield layer adjacent the third phase shift layer, and a light transparent portion adjacent the fourth phase shift layer, wherein the first outrigger mask has a diagonal relationship with respect to the second outrigger mask.

2. The phase shift mask device according to claim 1, wherein the second phase shift layer of the first and second rim masks are on the transparent substrate; and the first phase shift layer of the first and second rim masks are on the second phase shift layer.

3. The phase shift mask device according to claim 1, wherein the fourth phase shift layer of the first and second outrigger masks is on the transparent substrate, wherein the third phase shift layer of the first and second outrigger masks is on the fourth phase shift layer, and wherein the shield layer of the first and second outrigger masks is on the third phase shift layer.

4. The phase shift mask device according to claim 1, wherein the first phase shift layer of each of the first and second rim masks and the third phase shift layer of the first and second outrigger masks includes a half-tone phase shift mask.

5. The phase shift mask device according to claim 4, wherein the first phase shift layer of the first and second rim masks have a first opening; and the second phase shift layer of the first and second rim masks have a second opening, the first opening being larger than the second opening, and the second opening exposing a portion of the transparent substrate.

6. The phase shift mask device according to claim 4, wherein the third phase shift layer of the first and second outrigger masks has a first outer opening;

the fourth phase shift layer of the first and second outrigger masks has a first inner opening and a second outer opening, the first and second outer openings exposing a portion of the transparent substrate; and the shield layer of the first and second outrigger masks has a second inner opening, the first and second inner openings exposing a portion of the fourth phase shift layer of each of the first and second outrigger masks.

7. The phase shift mask device according to claim 6, wherein the first inner opening defines a main portion of the first and second outrigger masks; and the shield layer defines an edge portion surrounding the main portion.

8. The phase shift mask device according to claim 1, wherein the first phase shift layer and the third phase shift layer has a phase shift characteristic substantially complementary to a phase shift characteristic of the second phase shift layer and the fourth phase shift layer.

9. The phase shift mask device according to claim 1, wherein the shielding layer is a hollow pole.

10. The phase shift mask device according to claim 1, wherein the shielding layer has a substantially rectangular shape.

11. The phase shift mask device according to claim 1, wherein the shielding layer includes a chrome layer.

12. The phase shift mask device according to claim 1, wherein the shielding layer has an absorption factor of about 96% with respect to an exposure wavelength.

13. The phase shift mask device according to claim 1, wherein the half-tone phase shift mask has a light transmission factor of about 4–30%.

14. The phase shift mask device according to claim 1, wherein the second phase shift layer of the first and second rim masks and the fourth phase shift layer of the first and second outrigger masks have a light transmission factor of about 80–100%.

15. The phase shift mask device according to claim 1, wherein the transparent substrate includes glass.

16. The phase shift mask device according to claim 1, wherein a distance between a center of one of the first and second rim masks and a center of one of the first and second outrigger masks is in a range defined by the following:

$$D = 0.8 \frac{\lambda}{N \cdot A} \sim 2.2 \frac{\lambda}{N \cdot A}$$

where D is the distance, $\lambda$ is a wavelength of light, and N•A is a numerical aperture.

17. The phase shift mask device according to claim 1, wherein respective centers of the first rim mask, the second rim mask, the first outrigger mask, and the second outrigger mask define a square shape.

18. The phase shift mask device according to claim 1, further including an auxiliary mask at a central area relative to the first rim mask, the second rim mask, the first outrigger mask, and the second outrigger mask, the auxiliary mask having a phase shift characteristic substantially complementary to the first rim mask, the second rim mask, the first outrigger mask, and the second outrigger mask, respectively.

19. The phase shift mask device according to claim 18, wherein the auxiliary mask has a checker board pattern including four areas respectively complementary to the first rim mask, the second rim mask, the first outrigger mask, and the second outrigger mask.

20. A phase shift mask device comprising:
   a substrate;
   a first mask having a first phase shift characteristic on a first region of the substrate;
   a second mask having a second phase shift characteristic on a second region of the substrate, the second phase characteristic being different from the first phase shift characteristic;
   a third mask having a third phase shift characteristic on a third region of the substrate, the third region having a diagonal relationship with the first region, and the third phase shift characteristic being substantially same as the first phase shift characteristic; and
   a fourth mask having a fourth phase shift characteristic on a fourth region of the substrate, the fourth region having a diagonal relationship with the second region, and the fourth phase shift characteristic being substantially same as the second phase shift characteristic.

21. The phase shift mask device according to claim 20, wherein the first and third masks are rim masks.

22. The phase shift mask device according to claim 21, wherein each of the rim masks has four sides and includes:
   a first phase shift layer on the substrate;
   a second phase shift layer on the first phase shift layer; and
   a light transparent portion adjacent the second phase shift layer.

23. The phase shift mask device according to claim 20, wherein the second and fourth masks are outrigger masks.

24. The phase shift mask device according to claim 23, wherein each of the outrigger masks has four sides and includes:
   a third phase shift layer on the substrate;
   a fourth phase shift layer on the first phase shift layer;
   a shielding layer on the fourth phase shift layer; and
   a light transparent portion adjacent the fourth phase shift layer.

25. The phase shift mask device according to claim 20, wherein the first phase shift characteristic and the second phase shift characteristic are complementary to each other, and the third phase shift characteristic and the fourth phase shift characteristic are complementary to each other.

26. The phase shift mask device according to claim 20, further including an auxiliary mask at a central area relative to the first, second, third, and fourth masks, the auxiliary mask having a phase shift characteristic substantially complementary to the first, second, third, and fourth masks, respectively.

27. A method for making a phase shift mask device having a transparent substrate, the method comprising the steps of:
   preparing a transparent substrate having first, second, third and fourth regions;
   forming a first phase shift layer on the transparent substrate;
   forming a second phase shift layer on the first phase shift layer;
   forming a shielding layer on the second phase shift layer;
   patterning the first phase shift layer, the second phase shift layer and the shielding layer to form first and second rim masks on the first and second regions, respectively, and first and second outrigger masks on the third and fourth regions, respectively,
   wherein the first rim mask has a diagonal relationship with respect to the second rim mask,
   wherein the first outrigger mask has a diagonal relationship with respect to the second outrigger mask,
   wherein the first and second rim masks include the first phase shift layer, the second phase shift layer adjacent the first phase shift layer, and the first light transparent portion adjacent the second phase shift layer, and
   wherein the first and second outrigger masks include the first phase shift layer, the second phase shift layer adjacent the first phase shift layer, the shielding layer adjacent the second phase shift layer, and a second light transparent portion adjacent the second phase shift layer.

28. The method according to claim 27, wherein
   the step of forming the first phase shift layer of the first and second rim masks includes the step of forming a first opening; and
   wherein the step of forming the second phase shift layer of the first and second rim masks includes the step of forming a second opening, the first opening being larger than the second opening, and the first opening exposing a portion of the transparent substrate.

29. The method according to claim 27, wherein
   the step of forming the first phase shift layer of the first and second outrigger masks includes the step of forming a first inner opening and a first outer opening;
   wherein the step of forming the second phase shift layer of the first and second outrigger masks includes the step of forming a second outer opening, the first and second outer openings exposing a portion of the transparent substrate; and
   wherein the step of forming the shield layer of the first and second outrigger masks includes the step of forming a second inner opening, the first and second inner openings exposing a portion of the second phase shift layer of each of the first and second outrigger masks.

30. The phase shift mask device according to claim 27, wherein, in the step of forming the first and second phase shift layers, the first phase shift layer of each of the first and second rim masks and the first and second outrigger masks is formed to have a phase shift characteristic substantially complementary to a phase shift characteristic of the second phase shift layer of each of the first and second rim masks and the first and second outrigger masks.

31. The method according to claim 27, wherein the shielding layer is formed to be a hollow pole.

32. The method according to claim 27, wherein the shielding layer is formed to have a substantially rectangular shape.

33. The method according to claim 27, wherein, in the step of pattering the first phase shift layer, the second phase shift layer and the shielding layer, the first and second rim masks and the first and second outrigger masks are formed such that a distance between a center of one of the first and second rim masks and a center of one of the first and second outrigger masks is in a range defined by the following:

$$D = 0.8 \frac{\lambda}{N \cdot A} \sim 2.2 \frac{\lambda}{N \cdot A}$$

where D is the distance, $\lambda$ is a wavelength of light, and N•A is a numerical aperture.

34. The method according to claim 27, wherein, in the step of patterning the first phase shift layer, the second phase shift layer and the shielding layer, the first rim mask, the second rim mask, the first outrigger mask, and the second outrigger mask are formed such that respective centers define a square shape.

35. The method according to claim 27, further including the steps of forming an auxiliary mask at a central area relative to the first rim mask, the second rim mask, the first outrigger mask, and the second outrigger mask, the auxiliary mask having a phase shift characteristic substantially complementary to the first rim mask, the second rim mask, the first outrigger mask, and the second outrigger mask, respectively.

36. The method according to claim 35, wherein, in the step of forming an auxiliary mask, the auxiliary mask is formed to have a checker board pattern including four areas respectively complementary to the first rim mask, the second rim mask, the first outrigger mask, and the second outrigger mask.

37. A method for manufacturing a phase shift mask, the method comprising the steps of:

sequentially forming a phase shift layer, a half-tone phase shift layer, and a shielding layer on a transparent substrate;

patterning the shielding layer to form two shielding layer patterns having hollow centers;

patterning the half-tone phase shift layer to form two half-tone phase shift layer patterns below the two shielding layer patterns using a first mask;

removing a portion of the phase shift layer to form a corresponding open area exposing the substrate and within the half-tone phase shift layer patterns using a second mask; and patterning the phase shift layer to form two open areas at outer sides of the half-one phase shift layer patterns.

38. The method according to claim 37, further comprising the steps of:

defining one area corresponding to a portion between the two shielding layer patterns and the two open areas of the phase shift layer for forming an auxiliary mask portion;

dividing the one area into four sections in the shape of a checker board;

patterning the half-tone phase shift layer to form open areas over the four sections; and patterning the phase shift layer to form open areas in two areas having the symmetrical relation among said four areas.

39. The method according to claim 38, wherein the auxiliary mask portion is formed to prevent a reinforcing coherence with respect to light of an open area within adjacent shielding layer patterns and the open area in the shielding layer pattern and the phase shift layer.

40. The method according to claim 37, wherein the transparent substrate is formed of glass.

41. The method according to claim 37, wherein the shield layer is formed of chrome.

42. The method according to claim 37, wherein the shielding layer is formed as a rectangle in a plain view.

43. The method according to claim 37, wherein the open areas within the shielding layer patterns are formed to have a resolution capacity, and the open area in the phase shift layer is formed to be symmetrical with the shielding layer.

44. The method according to claim 37, wherein the half-tone phase shift layer is formed to have a light transmission factor of about 4~30%.

45. The method according to claim 37, wherein the shielding layer is formed to have an absorption factor of about 96% with respect to an exposure wavelength.

46. The method according to claim 37, wherein the phase shift layer is formed to have a light transmission factor of about 80~100%.

47. The method according to claim 37, wherein provided that a distance between centers of the open area within the shielding layer patterns and the open area in the phase shift layer symmetrical to the shielding layer pattern with respect to a plane is denoted by D, a wavelength of light is denoted by $\lambda$, and numerical aperture is denoted by N•A, the open area is formed by using the following formula:

$$D = 0.8 \frac{\lambda}{N \cdot A} \sim 2.2 \frac{\lambda}{N \cdot A}$$

* * * * *

UNITED STATES PATENT AND TRADEMARK OFFICE
CERTIFICATE OF CORRECTION

PATENT NO. : 5,856,049
DATED : January 5, 1999
INVENTOR(S) : Jun Seok Lee

It is certified that error appears in the above-indentified patent and that said Letters Patent is hereby corrected as shown below:

Column 15, line 17, change "pattering" to --patterning--.

Signed and Sealed this

Eighteenth Day of May, 1999

Attest:

Attesting Officer

Q. TODD DICKINSON

Acting Commissioner of Patents and Trademarks